United States Patent
Murakawa

(10) Patent No.: US 7,353,482 B2
(45) Date of Patent: Apr. 1, 2008

(54) ROUTING DISPLAY FACILITATING TASK OF REMOVING ERROR

(75) Inventor: Ikuko Murakawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 17 days.

(21) Appl. No.: 11/419,909

(22) Filed: May 23, 2006

(65) Prior Publication Data

US 2007/0204253 A1    Aug. 30, 2007

(30) Foreign Application Priority Data

Feb. 27, 2006    (JP)    .............................. 2006-050787

(51) Int. Cl.
*G06F 17/50*    (2006.01)
(52) U.S. Cl. .................... 716/11; 716/8; 716/9; 716/10
(58) Field of Classification Search .................. 716/11, 716/10, 9, 8

See application file for complete search history.

(56) References Cited

U.S. PATENT DOCUMENTS 5,691,913 A * 11/1997 Tsuchida et al. ................ 716/8
2004/0025085 A1 * 2/2004 Yoon et al. .................... 714/37

* cited by examiner

*Primary Examiner*—Sun James Lin
(74) *Attorney, Agent, or Firm*—Staas & Halsey LLP

(57) ABSTRACT

A layout editor apparatus draws line segments constituting a first interconnect line connecting between an output pin and a first input pin so as to draw the first interconnect line as a straight line formed of the line segments connected in a line extending from the output pin only in a first direction, and draws line segments constituting a second interconnect line connecting between a branch point and a second input pin so as to draw the second interconnect line as a straight line formed of the line segments connected in a line extending only in the first direction from a point that is displaced from the branch point on the first interconnect line in a second direction perpendicular to the first direction, wherein the displayed lengths of the line segments are proportional to their physical lengths, and the displayed widths of the line segments reflect their physical widths.

10 Claims, 27 Drawing Sheets

FIG.8

| AREA NUMBER | MAXIMUM AVAILABLE CONTIGUOUS SPACE |
|---|---|
| 1 | 5 |
| 2 | 7 |
| 3 | 9 |
| 4 | 18 |
| 5 | 10 |
| 6 | 0 |
| : | : |

FIG.9

| LIBRARY NUMBER | LIBRARY SIZE |
|---|---|
| 1 | 4 |
| 2 | 8 |
| 3 | 16 |
| 4 | 12 |
| 5 | 12 |
| 6 | 8 |
| : | : |

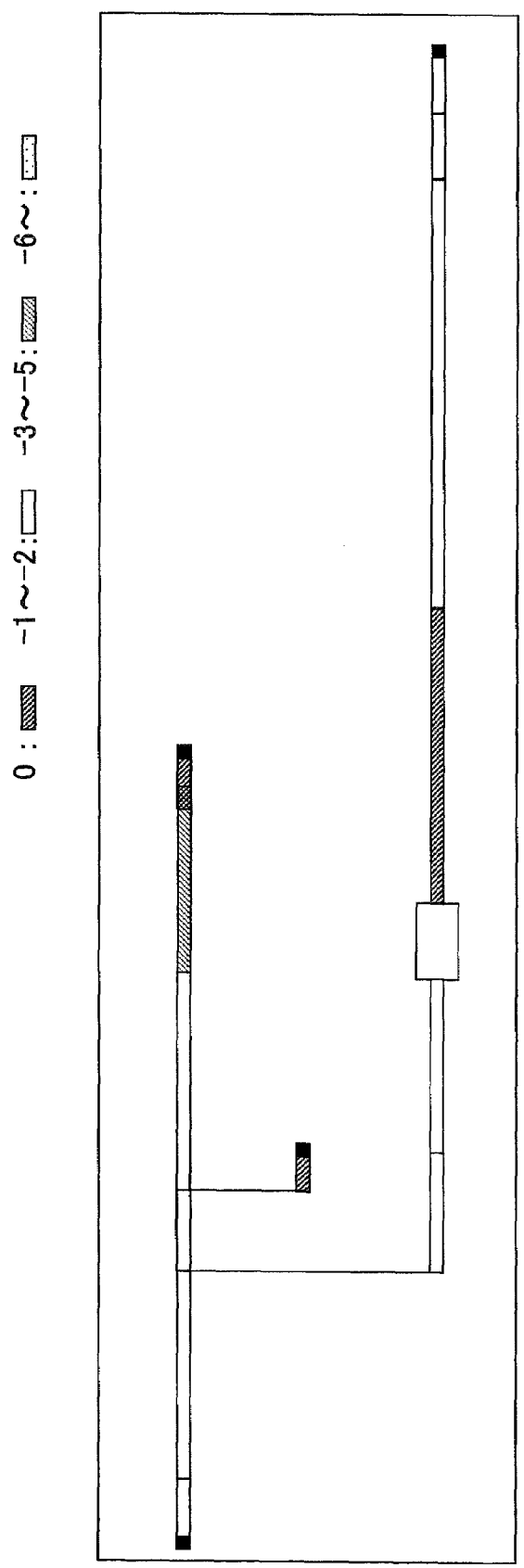

FIG.12

| AREA NUMBER | DEGREE OF LINE CONGESTION |
|---|---|
| 1 | −3 |
| 2 | 0 |
| 3 | −1 |
| 4 | −4 |
| 5 | −4 |
| 6 | 0 |
| : | : |

FIG.13

| INTERCONNECT LAYER | PRINCIPAL AXIS DIRECTION | MINIMUM ROUTING INTERVAL |
|---|---|---|
| 1 | X | 2 |
| 2 | Y | 2 |
| 3 | X | 2 |
| 4 | Y | 2 |
| 5 | X | 4 |
| 6 | Y | 4 |
| : | | : |

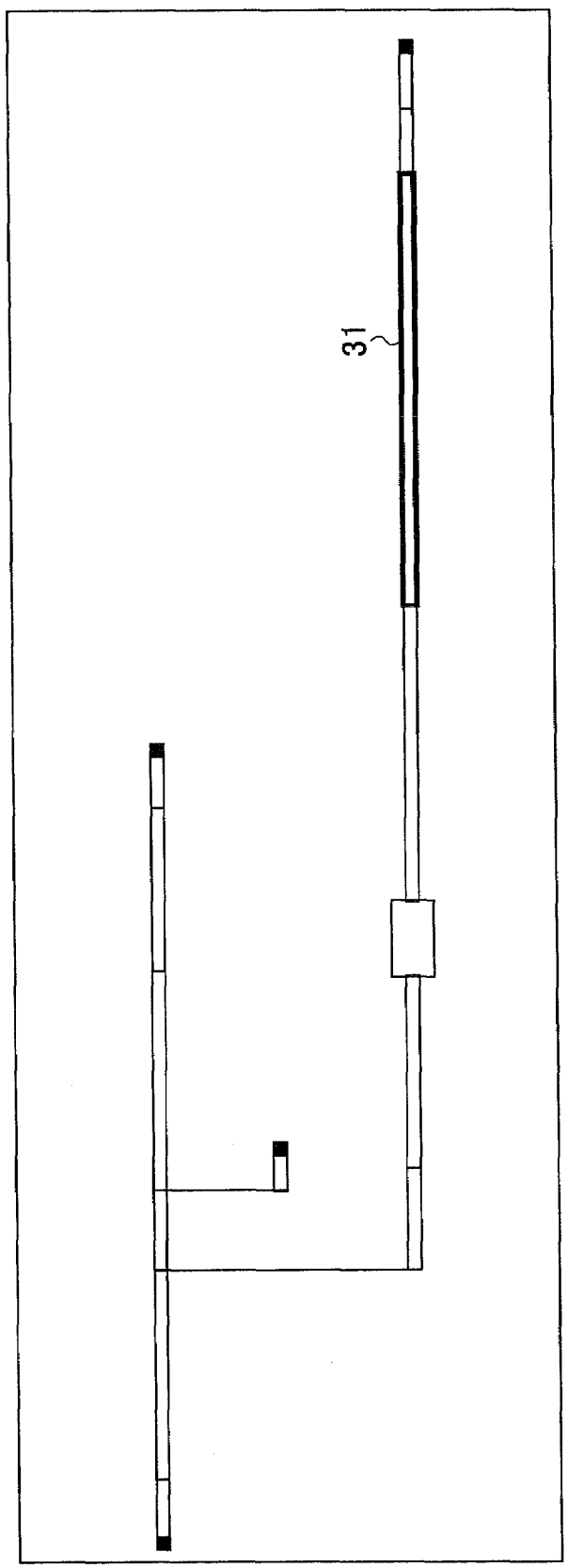

FIG.16

| INPUT PIN CHARACTERISTIC | TRUE BUFFER | OUTPUT PIN CHARACTERISTIC | NECESSARY SPACE |
|---|---|---|---|
| ■ | True00 | ■ | 4 |
| ▨ | True08 | ▩ | 8 |
| ▩ | True16 | ▩ | 12 |

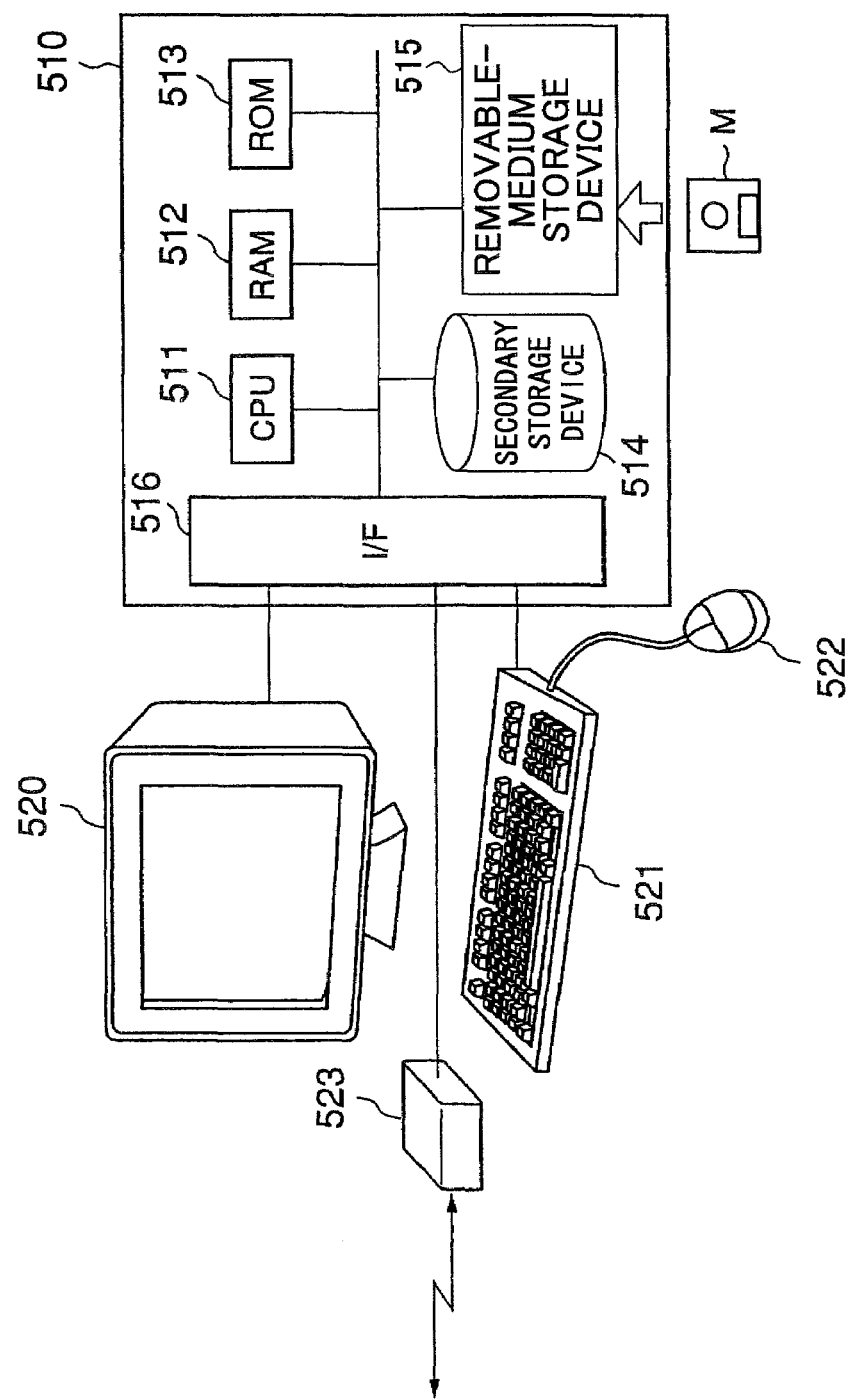

ROUTING DISPLAY FACILITATING TASK OF REMOVING ERROR

CROSS-REFERENCE TO RELATED APPLICATIONS

The present application is based upon and claims the benefit of priority from the prior Japanese Patent Application No. 2006-050787 filed on Feb. 27, 2006, with the Japanese Patent Office, the entire contents of which are incorporated herein by reference.

BACKGROUND OF THE INVENTION

1. Field of the Invention

The present invention generally relates to computer-aided design apparatuses and layout display methods, and particularly relates to a layout editor apparatus and a routing display method.

2. Description of the Related Art

In the LSI designing of recent years, due to an increase in the circuit density of semiconductor integrated circuits, it has become indispensable to modify the logical design and physical design at the stage of layout design for the purpose of correcting circuit characteristics such as timing error and crosstalk. In so doing, a placement-&-routing tool that takes into account the effects of timing and crosstalk may automatically correct the circuit characteristics successfully in some cases, but, in other cases, the use of a layout editor may become necessary to perform manual correction.

In order to ensure the successful removal of errors, an effect spreading from the corrected portion to other portions should be kept to a minimum. While taking into account these factors, the layout designer needs to resize certain cells by use of a layout editor after detailed routing, or to insert one-input-&-one-output cell (a true buffer or two inverter buffers) near an interconnection path and remove a portion of the interconnection for the purpose of reconnection.

When a true buffer is to be inserted, for example, the layout designer works according to the procedure as follows. (1) It is determined into which net the buffer is to be inserted. (2) It is determined into which portion (logical position) on the netlist the buffer is to be inserted. (3) It is determined into which location (physical position) in the layout the buffer is to be inserted. (4) The characteristics of the buffer to be inserted are determined (selected). (5) The design is changed to reflect the modification (i.e., the logic is changed, and the inserted buffer is placed). (6) The net to be connected to the inserted buffer is routed, thereby removing the routing error.

Tasks required for each of the above-described steps are as follows. As shown in FIG. 1, for example, the layout of a net having a path 14 inclusive of line segments 10, 11, 12, and 13 and causing a setup error is displayed on screen by use of a layout editor. In item (1) of the above-described procedure, the layout designer ascertains that the delay of the line segment 12 on the path 14 is too large, and uses the layout editor to display the net inclusive of this portion on screen as shown in FIG. 2. In FIG. 2, a net 15 illustrated as a series of solid connected lines is the net into which the buffer is to be inserted.

In item (2) of the procedure, then, the layout designer examines the logical structure (the structure of logical connections between cells) by looking at the layout displayed on screen as shown in FIG. 2, thereby determining the logical position into which the buffer is to be inserted. For example, the position corresponding to a net portion 16 may be selected as the buffer insertion position. At this time, the layout designer needs to determine to which pins of which buffers the inserted buffer is to be connected.

In item (3) of the procedure, the physical position (two dimensional coordinates in the displayed layout) at which the buffer is to be actually placed is determined in order to insert the buffer into the net portion 16 in the layout displayed on screen as shown in FIG. 2. At this time, it is required that there is sufficient space for the buffer to be inserted and for routing to be performed at and around the insertion point, so that the layout designer needs to acquire relevant information from the layout editor. Further, the layout designer needs to remember the coordinates of the insertion point for item (5) of the procedure.

In item (4) of the procedure, the characteristics of the buffer to be inserted are determined (selected). When this selected buffer is inserted into the insertion point, such insertion should result in the timing error being reduced. However, the selection of the characteristics of the buffer to be inserted is solely relied on the experience of the layout designer.

In item (5) of the procedure, a buffer 17 is placed as shown in the left-hand side of FIG. 3 in the layout displayed on screen as shown in FIG. 2. In item (6) of the procedure, an existing interconnection is cut off around the insertion point as shown in the center of FIG. 3 in the layout displayed on screen as shown in FIG. 2, thereby removing an unnecessary portion 18. Thereafter, as shown in the right-hand side of FIG. 3, a new net 19 is routed manually by substantially copying the removed portion. Further, there is a need to fix the portion leading from the cut-off point to the pins and the portion omitted in the manual routing by use of a routing tool.

The method of modifying the logical design and physical design according to the procedure as described above has problems as follows. Since there is a need to examine (contemplate) the logical structure of a net and the like by visually examining the layout displayed on screen as shown in FIG. 2, it is difficult to grasp the logical connections of the net, which results in a lengthy time being required to decide the strategy for design modification. That is, with the display of a net by use of a layout editor, it is difficult to instantly grasp the outline of interconnections, so that a lengthy time is required to determine a specific strategy.

Moreover, there is another problem in that it takes time to determine the position into which a cell is to be inserted. Namely, there are needs to find available space for cell insertion through visual inspection and to acquire legitimate coordinates complying with the layout rules at the time of specifying the placement coordinates. Such tasks require labor and time.

Further, there is no measure to indicate the appropriateness/inappropriateness of each combination of the type of an inserted cell and the position of insertion, so that it is necessary to perform the whole procedure again upon failure. That is, no means is provided to estimate whether a further error is to be generated by a suggested combination of the characteristics (drive power, load capacitance, and so on) of the cell to be inserted, the distances from the preceding cell and to the following cell, and the characteristics of these cells.

Moreover, even when the characteristics of the cell to be inserted and the coordinates of the insertion are determined, there is a need to manually generate commands for modifying the logical design data and physical design data such as to reflect the cell insertion. That is, the tools for aiding the tasks to generate these commands are not incorporated in the layout editor. Accordingly, a lengthy time is necessary to generate a cell insertion command, which may serve as a factor to create error.

Further, there is a problem in that the tool to recycle an original interconnection for a newly added net is not incorporated in the layout editor. This necessitates the manual reconstruction of interconnects, which requires labor and time.

Accordingly, there is a need for a routing display method and layout editor apparatus that can display layout-related information necessary for the modification task performed for the purpose of removing an error in such a display format that the logical connection and structure of the net can be easily understood.

SUMMARY OF THE INVENTION

It is a general object of the present invention to provide a routing display method and layout editor apparatus that substantially obviate one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a routing display method and layout editor apparatus particularly pointed out in the specification in such full, clear, concise, and exact terms as to enable a person having ordinary skill in the art to practice the invention.

To achieve these and other advantages in accordance with the purpose of the invention, the invention provides a layout editor apparatus, which includes a data memory to store a program, logical design data concerning a circuit, layout data concerning the circuit, an image frame memory to store display data representing a display screen, and a computation unit configured to process the logical design data and the layout data based on the program stored in the data memory, wherein the computation unit executes the program to extract, from the layout data stored in the data memory, data of a net of interest indicative of at least one output pin, one or more input pins, and line segments constituting the net of interest, and physical lengths and physical widths of the line segments, and draws the display screen in the image frame memory based on the data of the net of interest, and wherein the computation unit performs drawing the output pin of the net of interest, drawing each of the line segments constituting a first interconnect line connecting between the output pin and a first input pin selected from the one or more input pins so as to draw the first interconnect line as a straight line formed of the line segments connected in a line extending from the output pin only in a first direction, such that displayed lengths of the line segments are proportional to the physical lengths thereof, and such that displayed widths of the line segments reflect the physical widths thereof, drawing the first input pin at a terminal end of the first interconnect line extending from the output pin, drawing a mark indicative of a branch point on the first interconnect line drawn as the straight line if there is a second input pin coupled to the output pin, drawing each of the line segments constituting a second interconnect line connecting between the branch point and the second input pin so as to draw the second interconnect line as a straight line formed of the line segments connected in a line extending only in the first direction from a point that is displaced by a predetermined distance from the branch point on the first interconnect line in a second direction perpendicular to the first direction on the display screen, such that displayed lengths of the line segments are proportional to the physical lengths thereof, and such that displayed widths of the line segments reflect the physical widths thereof, and drawing the second input pin at a terminal end of the second interconnect line extending from the displaced point.

According to another aspect of the present invention, a method of drawing routing display includes drawing an output pin of a net of interest on a display screen, drawing line segments constituting a first interconnect line connecting between the output pin and a first input pin so as to draw the first interconnect line as a straight line formed of the line segments connected in a line extending from the output pin only in a first direction, such that displayed lengths of the line segments are proportional to physical lengths thereof, and such that displayed widths of the line segments reflect physical widths thereof, drawing the first input pin at a terminal end of the first interconnect line extending from the output pin, drawing a mark indicative of a branch point on the first interconnect line drawn as the straight line if there is a second input pin coupled to the output pin, drawing line segments constituting a second interconnect line connecting between the branch point and the second input pin so as to draw the second interconnect line as a straight line formed of the line segments connected in a line extending only in the first direction from a point that is displaced by a predetermined distance from the branch point on the first interconnect line in a second direction perpendicular to the first direction on the display screen, such that displayed lengths of the line segments are proportional to physical lengths thereof, and such that displayed widths of the line segments reflect the physical widths thereof, and drawing the second input pin at a terminal end of the second interconnect line extending from the displaced point.

A record medium having a program embedded therein for causing a computer to display a routing display, said program being configured to cause the computer to perform drawing an output pin of a net of interest on a display screen, drawing line segments constituting a first interconnect line connecting between the output pin and a first input pin so as to draw the first interconnect line as a straight line formed of the line segments connected in a line extending from the output pin only in a first direction, such that displayed lengths of the line segments are proportional to physical lengths thereof, and such that displayed widths of the line segments reflect physical widths thereof, drawing the first input pin at a terminal end of the first interconnect line extending from the output pin, drawing a mark indicative of a branch point on the first interconnect line drawn as the straight line if there is a second input pin coupled to the output pin, drawing line segments constituting a second interconnect line connecting between the branch point and the second input pin so as to draw the second interconnect line as a straight line formed of the line segments connected in a line extending only in the first direction from a point that is displaced by a predetermined distance from the branch point on the first interconnect line in a second direction perpendicular to the first direction on the display screen, such that displayed lengths of the line segments are proportional to physical lengths thereof, and such that displayed widths of the line segments reflect the physical widths thereof, and drawing the second input pin at a terminal end of the second interconnect line extending from the displaced point.

According to at least one embodiment of the present invention, the input/output pins and line segments of the net of interest are displayed as described above, so that the signal propagation distance (i.e., line length) serving as an important factor for examining the layout is assigned in one-to-one correspondence to the position in the first direction on the display screen. Accordingly, the length of a line from a certain output pin to a certain input pin can be visually appraised easily from the display on screen, and, also, the lengths of respective lines can be easily compared with each other. Further, the absolute position and relative positional relationship of each branch point can be visually appraised with ease, as being recognized in terms of the signal propagation distance. Moreover, it is easy to visually ascertain from the routing display which output pin (driver) drives which input pin(s) and how may input pins are driven by the output pin (driver) of interest. With this provision, the connection and structure of net interconnections are displayed in a visually friendly manner, thereby making it possible to reduce the time required to determine the strategy for logical modification and physical modification.

BRIEF DESCRIPTION OF THE DRAWINGS

Other objects and further features of the present invention will be apparent from the following detailed description when read in conjunction with the accompanying drawings, in which:

FIG. 8 is a drawing showing an example of data used to manage available contiguous space;

FIG. 9 is drawing showing a data example used for the purpose of managing a cell library that is provided as one of the libraries of the layout editor;

FIG. 10 is a drawing showing another example of a variation of the routing display;

FIG. 12 is a drawing showing an example of data used to manage the degree of line congestion;

FIG. 13 is a drawing showing an example of data used to manage interconnect layers;

FIG. 14 is a drawing showing another example of a variation of the routing display;

FIG. 16 is a drawing showing an example of data used to manage each cell;

FIG. 33 is a drawing showing the configuration of the layout editor apparatus according to the present invention.

DESCRIPTION OF THE PREFERRED EMBODIMENTS

In the following, embodiments of the present invention will be described with reference to the accompanying drawings.

Figure 4:
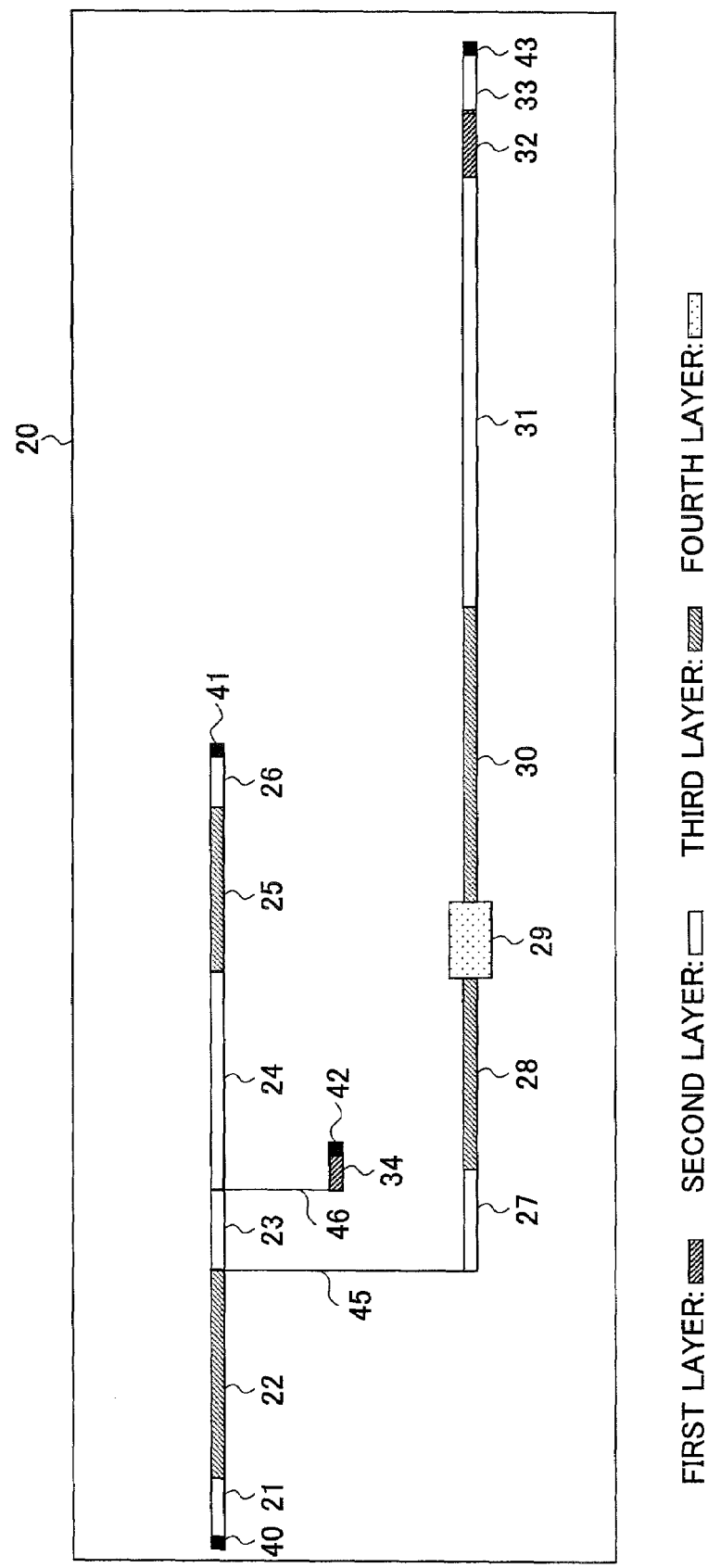
FIG. 4 is a drawing showing an example of routing display according to the present invention. 5.
Figure 5:
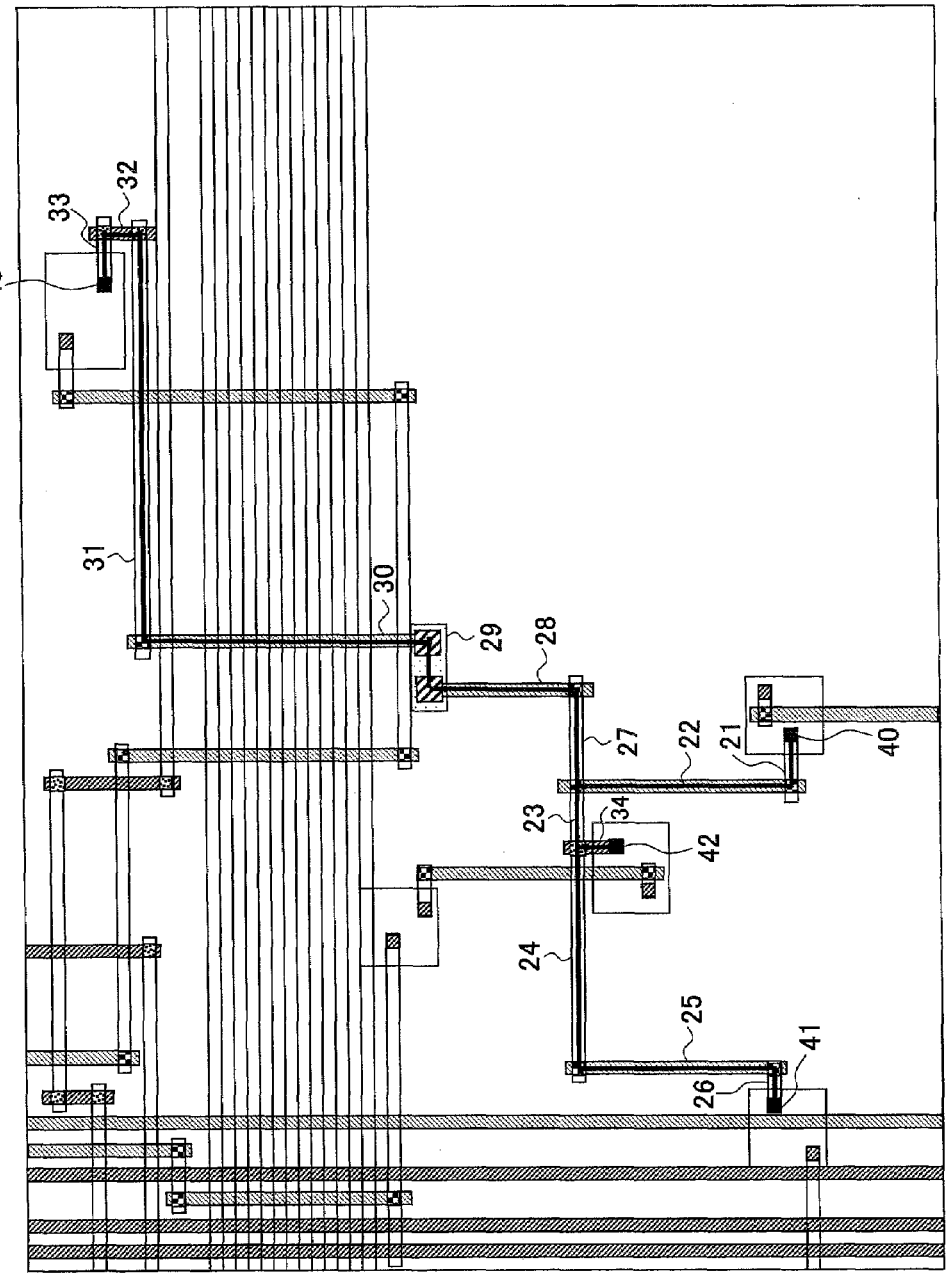
FIG. 5 is a drawing showing an example of layout display according to the present invention.

FIG. 4 is a drawing showing an example of routing display according to the present invention. As shown in FIG. 4, the layout editor of the present invention displays a routing display 20 on the screen of a display apparatus. The routing display 20 is presented separately from the normal layout display that is displayed on screen by the layout editor as shown in FIG. 5. A window to display the layout of FIG. 5 on the screen of the display apparatus may be presented along with another window for displaying the routing display 20, for example. In so doing, provision may be made to provide normal window operations such that one of the windows may be selected at will and brought to the front of the screen, for example.

In the layout display shown in FIG. 5, the net of interest (i.e., net to be modified) includes line segments 21 through 34, an output pin 40, and input pins 41 through 43. In FIG. 5, rectangle portions enclosing the output pin 40 and the input pins 41 through 43, respectively, represent respective cells (i.e., circuit elements such as transistors or logic gates). The line segments 21 through 34, the output pin 40, and the input pins 41 through 43 shown in the layout display of FIG. 5 corresponds to the line segments 21 through 34, the output pin 40, and the input pins 41 through 43 shown in the routing display 20 of FIG. 4.

The routing display 20 shown in FIG. 4 displays only input/output pins and line segments extracted from the actual layout elements. In so doing, the output pin 40 is displayed on one side (the left-hand side of the drawing in this example) of the display area, and the line segments 21 through 26 constituting a single line extending from the output pin 40 are connected together and arranged in a straight line extending in a first direction (i.e., in the horizontal direction in this example) for display. At the terminal end of the straight line comprised of the line segments 21 through 26 is displayed the input pin 41. Different interconnections between different pins are displayed at respective positions displaced in a second direction (i.e., the vertical direction in this example) perpendicular to the first direction. Namely, all the interconnections (lines) are displayed such as to extend in the first direction and lie side by side in the second direction. If there are branches halfway through the line, marks 45 and 46 indicative of branching are displayed, such that the line segments 27 through 33 and the line segment 34 corresponding to the parts extending from the branch points are displayed in rows different from the row in which the line segments forming the stem lies.

The lengths of the line segments 21 through 34 are displayed as being proportional to their life sizes. Further, the widths of the line segments 21 through 34 are displayed such that relative comparison with each other can be made (i.e., relative size relationship can be visually recognized). In the routing display 20, the directions in which the lines are actually extend, the distances between pins belonging to the same cell, and the presence of vias are all ignored.

In the present invention, the input/output pins and line segments of the net of interest are displayed as shown in FIG. 4, so that the signal propagation distance (i.e., line length) serving as an important factor for examining the layout is assigned in one-to-one correspondence to the position in the horizontal direction (first direction). Accordingly, the length of a line from a certain output pin to a certain input pin can be visually appraised easily from the display on screen, and, also, the lengths of respective lines can be easily compared with each other. Further, the absolute position and relative positional relationship of each branch point can be visually appraised with ease, as being recognized in terms of the signal propagation distance. Moreover, it is easy to visually ascertain from the routing display which output pin (driver) drives which input pin(s) and how may input pins are driven by the output pin (driver) of interest. With this provision, the connection and structure of net interconnections are displayed in a visually friendly manner, thereby making it possible to reduce the time required to determine the strategy for logical modification and physical modification.

In the routing display 20 of the present invention, as shown in FIG. 4, the line segments may be displayed in respective display appearance differing for different interconnect layers, such that the interconnect layers containing the line segments 21 through 34 can be easily identified. In so doing, the different display appearance may include different colors, different gray-scales, different textures, or the like. With the interconnect layer of each line segment being shown, it is easy to visually ascertain from the display on screen that the line segments situated in the upper layers may require a via for connection with an input/output pin. By examining such information, the layout designer can attend to logical modification and physical modification.

Figure 6:
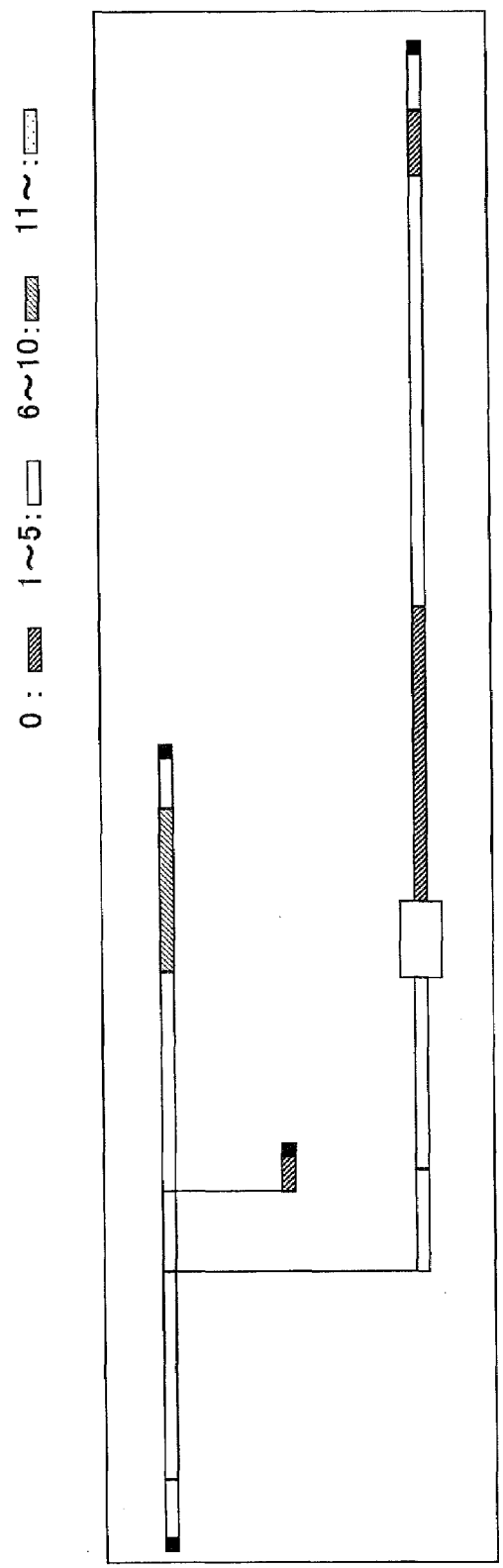
FIG. 6 is a drawing showing an example of a variation of the routing display. 7.

FIG. 6 is a drawing showing an example of a variation of the routing display 20. When a certain operation (key input, a click of a predetermined button by use of the mouse, or the like) is performed on the window that displays the routing display 20 of FIG. 4, the routing display 20 may be modified to that shown in FIG. 6 in response to such operation. Alternatively, a new window that displays the routing display 20 of FIG. 6 may be presented in addition to the window that displays the routing display 20 of FIG. 4.

In the routing display 20 of FIG. 6, each line segment is displayed in display appearance differing depending on the amount of available contiguous space. In so doing, the different display appearance may include different colors, different gray-scales, different textures, or the like. In the example shown in FIG. 6, the situations are categorized into the case in which the available contiguous space is 0, the case in which the available contiguous space is from 1 to 5, the case in which the available contiguous space is from 6 to 10, or the case in which the available contiguous space is larger than 11. Then, different display appearance is assigned to the different cases.

The available contiguous space is an indication of the size of available space into which a cell can be newly inserted, as will be described in the following. With the routing display 20 as shown in FIG. 6, the layout designer can easily ascertain from the display on screen into which line segment position the cell of what size can be inserted.

Figure 7:
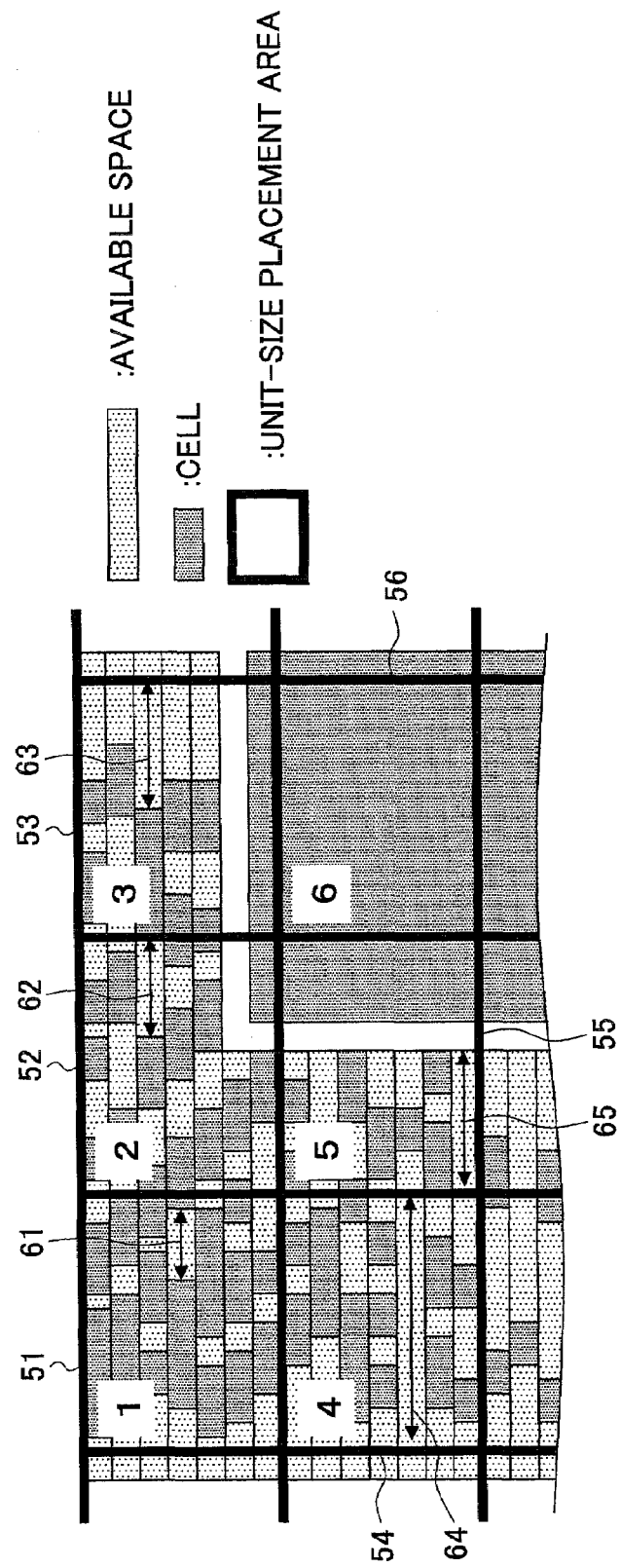
FIG. 7 is a drawing for explaining available contiguous space.

FIG. 7 is a drawing for explaining the available contiguous space. In FIG. 7, the arrangement of cells in the cell placement plane (i.e., the diffusion layer of the substrate) is shown. The cell placement plane is divided into a plurality of unit-size placement areas that are arranged in rows and columns. Six unit-size placement areas illustrated in FIG. 7 are unit-size placement areas 51 through 56. Here, the unit-size placement area is a vicinity area of a point on a line segment that is suitable as a position where a cell to be newly inserted is placed when the cell is inserted into the point on the line segment.

The unit-size placement area 51 has a maximum available contiguous space 61. The maximum available contiguous space 61 is the one of the available contiguous spaces in the unit-size placement area 51 that is largest in length. By the same token, the unit-size placement areas 52 through 55 have maximum available contiguous spaces 62 through 65, respectively. The unit-size placement area 56 does not have any available contiguous space.

FIG. 8 is a drawing showing an example of data used to manage available contiguous space. As shown in FIG. 8, the unit-size placement areas are assigned with area numbers, and are managed according to these area numbers. As shown in FIG. 7, for example, the unit-size placement areas 51 through 56 are assigned with area numbers 1 through 6, respectively.

As shown in FIG. 8, a maximum available contiguous space is assigned in one-to-one correspondence to an area number. In this example, the size of the maximum available contiguous space of the unit-size placement area having area number "1" is equal to five unit spaces. This means that the length of the maximum available contiguous space 61 of the unit-size placement area 51 in FIG. 7 is equal to five unit spaces. By the same token, the size of the maximum available contiguous space of the unit-size placement area having area number "2" is equal to seven unit spaces. This means that the length of the maximum available contiguous space 62 of the unit-size placement area 52 in FIG. 7 is equal to seven unit spaces. By the same token, the sizes of the maximum available contiguous spaces of the unit-size placement areas having area numbers "3" through "6" are equal to 9, 18, 10, and 0 unit spaces, respectively.

FIG. 9 is drawing showing a data example used for the purpose of managing a cell library that is provided as one of the libraries of the layout editor. As shown in FIG. 9, library cells having library numbers "1" through "6" are 4, 8, 16, 12, 12, and 8 in size, respectively. Since the maximum available contiguous space of the unit-size placement area having area number "3" shown in FIG. 8 is 9, this unit-size placement area can accommodate a library cell having library number "1", "2", or "6", but cannot accommodate other library cells corresponding to library numbers "3", "4", and "5". Namely, if the line segment of interest is situated in the unit-size placement area 53 having area number "3", the cells that can be inserted into a point on this line segment of interest are the library cells having library numbers "1", "2", and "6".

FIG. 10 is a drawing showing another example of a variation of the routing display 20. When a certain operation (key input, a click of a predetermined button by use of the mouse, or the like) is performed on the window that displays the routing display 20 of FIG. 4 or FIG. 6, the routing display 20 may be modified to that shown in FIG. 10 in response to such operation. Alternatively, a new window that displays the routing display 20 of FIG. 10 may be presented in addition to the window that displays the routing display 20 of FIG. 4 or FIG. 6.

In the routing display 20 of FIG. 10, each line segment is displayed in display appearance differing depending on the degree of line congestion. In so doing, the different display appearance may include different colors, different gray-scales, different textures, or the like.

In the example shown in FIG. 10, the situations are categorized into the case in which the degree of line congestion is 0, the case in which the degree of line congestion is from −1 to −2, the case in which the degree of line congestion is from −3 to −5, or the case in which the degree of line congestion is smaller than −6. Then, different display appearance is assigned to the different cases.

The degree of line congestion is an indication of how easy it is to place an interconnection extending from a pin. The smaller the minus value (the larger the absolute value), the less congested the lines are, and the larger the margin is. With the routing display 20 as shown in FIG. 10, the layout designer can easily ascertain from the display on screen which line segment is easy to be connected to an input/output pin, i.e., into which line segment a new cell can easily be inserted.

Figure 11A:
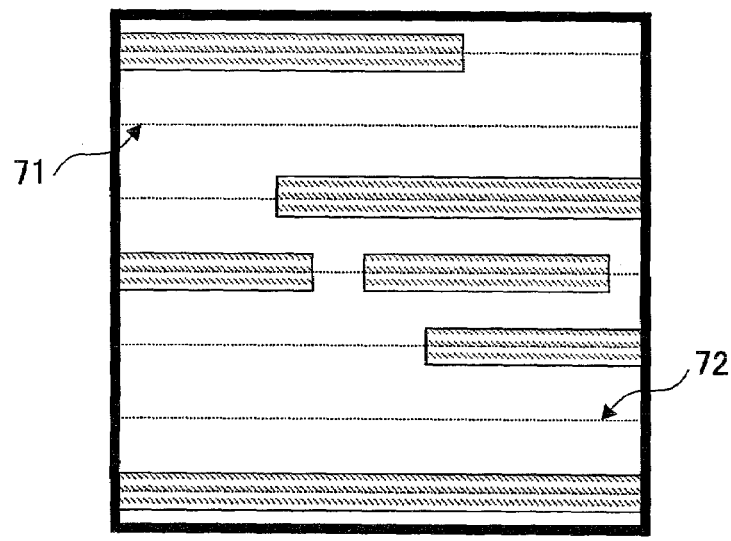
FIGS. 11A and 11B are drawings for explaining the degree of line congestion.
Figure 11B:
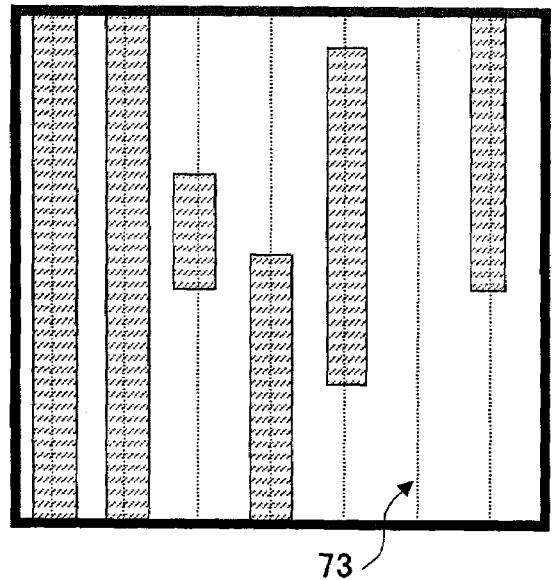

FIGS. 11A and 11B are drawings for explaining the degree of line congestion. FIG. 11A is a plan view showing the placement of interconnect lines in the first layer of a unit-size placement area corresponding to the line segment of interest, and FIG. 11B is a plan view showing the placement of interconnect lines in the second layer of the unit-size placement area corresponding to the line segment of interest. In the first layer shown in FIG. 11A, routing tracks (i.e., virtual lines indicating the positions at which interconnect lines are placed) extend in the principal axis direction (i.e., the preferred line direction in this interconnect layer), and there are two available tracks 71 and 72 along which no interconnect lines are placed. In the second layer shown in FIG. 11B, routing tracks (i.e., virtual lines indicating the positions at which interconnect lines are placed) extend in the principal axis direction (i.e., the preferred line direction in this interconnect layer), and there is one available track 73 along which no interconnect line is placed.

The degree of line congestion is equal to the sum of the numbers of available tracks of respective interconnect layers added up for all the interconnect layers, with a minus sign being attached thereto. For the sake of convenience of explanation, the total number of interconnect layers is assumed to be 2. In such a case, the degree of line congestion of the line segment of interest with respect to the unit-size placement area shown in FIGS. 11A and 11B is −3.and 11B is −3.

FIG. 12 is a drawing showing an example of data used to manage the degree of line congestion. As shown in FIG. 12, a datum indicative of the degree of line congestion is assigned in one-to-one correspondence to an area number. In this example, the unit-size placement areas corresponding to area numbers "1" through "6" have the degrees of line congestion −3, 0, −1, −4, −4, and 0, respectively.

The interconnect layers as shown in FIGS. 11A and 11B are managed by use of data as shown in FIG. 13. FIG. 13 is a drawing showing an example of data used to manage interconnect layers. As shown in FIG. 13, interconnect layers are assigned with respective interconnect layer numbers, and a principal axis direction and a routing track interval (i.e., minimum routing interval) are defined with respect to each interconnect layer. X indicates a horizontal direction, and Y indicates a vertical direction, for example.

FIG. 14 is a drawing showing yet another example of a variation of the routing display 20. When a certain operation (key input, a click of a predetermined button by use of the mouse, or the like) is performed on the window that displays the routing display 20 of FIG. 4, FIG. 6, or FIG. 10, the routing display 20 may be modified to that shown in FIG. 14 in response to such operation. Alternatively, a new window that displays the routing display 20 of FIG. 14 may be presented in addition to the window that displays the routing display 20 of FIG. 4, FIG. 6, or FIG. 10.

In FIG. 14, a line segment having an adjacent interconnect line is displayed in such a manner distinguishable from other line segments. In this example, the line segment 31 is displayed in appearance distinguishable from other line segments as having an adjacent interconnect line. The distinguishable display appearance may include a different color, a different gray-scale, a different texture, or blinking appearance, or the like.

An adjacent interconnect line is an interconnect line that is placed in parallel on a track adjacent to that of the line segment of interest. The present of such interconnect line causes crosstalk, increasing the risk of error occurrence with respect to the line segment of interest. Accordingly, the line segment displayed as having an adjacent interconnect line such as the line segment 31 of FIG. 14 may be treated to remove error by moving the position thereof or inserting a buffer into a proper point. Such line segment can thus be considered as a preferred target to be modified.

FIGS. 1SA and 15B are drawings showing yet another example of a variation of the routing display 20. When a certain operation (key input, a click of a predetermined button by use of the mouse, or the like) is performed on the window that displays the routing display 20 of FIG. 4, FIG. 6, FIG. 10, or FIG. 14, the routing display 20 may be modified to that shown in FIG. 15A in response to such operation. Alternatively, a new window that displays the routing display 20 of FIG. 15A may be presented in addition to the window that displays the routing display 20 of FIG. 4, FIG. 6, FIG. 10, or FIG. 14.

In the routing display 20 of FIG. 1SA, each output pin is displayed in display appearance that reflects the driver power of the corresponding driver cell. Further, each input pin is displayed in display appearance that reflects the size of the load of the corresponding receiver cell. Moreover, each line segment is displayed in display appearance that reflects the degree of degradation of the propagating signal (i.e., the degree of reduction in the steepness of signal rising edges and falling edges). Such display appearance may include different colors, different gray-scales, different textures, or the like.

Figure 15A:
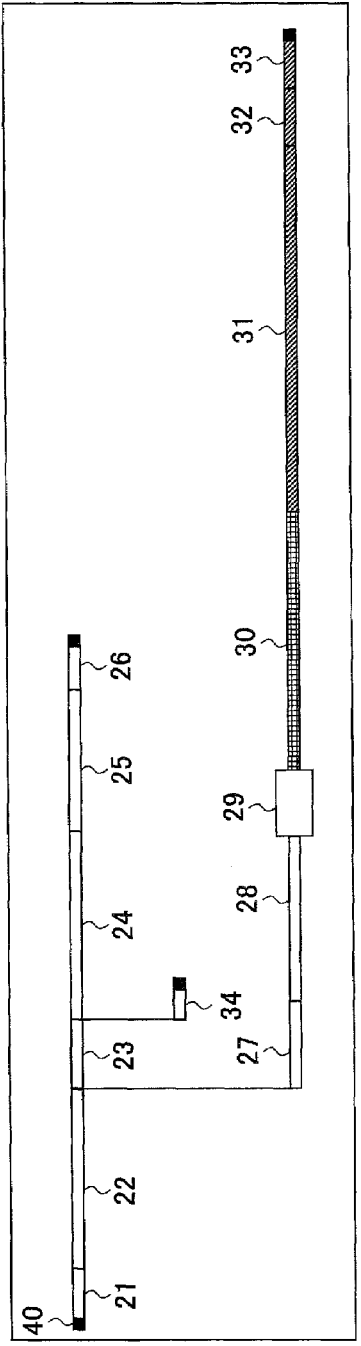
FIGS. 15A and 15B are drawings showing yet another example of a variation of the routing display.
Figure 15B:
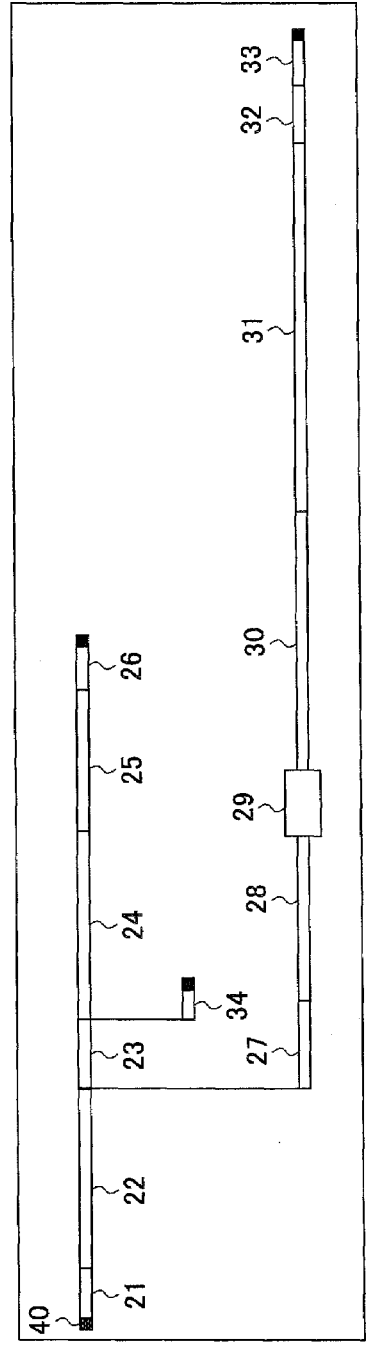

In the example of FIG. 15A, the drive power of the driver of the output pin 40 is "weak", so that although the signal conditions are proper on the line segments 21 through 28 and 34, an alert condition is detected due to signal degradation on the line segment 30, with an error condition occurring on the line segments 31 through 33. With such display, the layout designer may point the mouse pointer to the position of the output pin 40 and then click, for example, followed by changing the driver power assigned to the output pin 40. The routing display is then displayed again. As shown in FIG. 15B, for example, if the drive power of the driver of the output pin 40 is set to "medium", all the line segments 21 through 34 can be placed in proper condition. This can be seen from the signal conditions of the line segments displayed on screen.

In this manner, the line length that is properly drivable by an output pin is displayed (as signal conditions), so that the displayed information can be utilized at the time of selecting the position into which a cell is inserted. Further, the size of the drive power of an output pin and the size of the load of an input pin are displayed, so that such displayed information can be utilized at the time of resizing the driver cell and/or the receiver cell. For example, when the signal condition is either alert or error, a cell may be inserted into a point that is closer to the output pin than the alert/error point. If the insertion of a cell is not possible, the load of the cell to be inserted may be reduced, or the drive power may be increased by resizing the driver. The routing display may be presented again after such modification, thereby making it possible to ensure that there is no error.

Each cell may be managed by use of data as shown in FIG. 16. FIG. 16 is a drawing showing an example of data used to manage each cell. As shown in FIG. 16, in the case of a true buffer, one true buffer is assigned with one input pin characteristic, one buffer name, one output pin characteristic, and one required space. Such a list of cells is presented together with the display of FIG. 15A or 15B, so that the layout designer can select a proper buffer.

Figure 17:
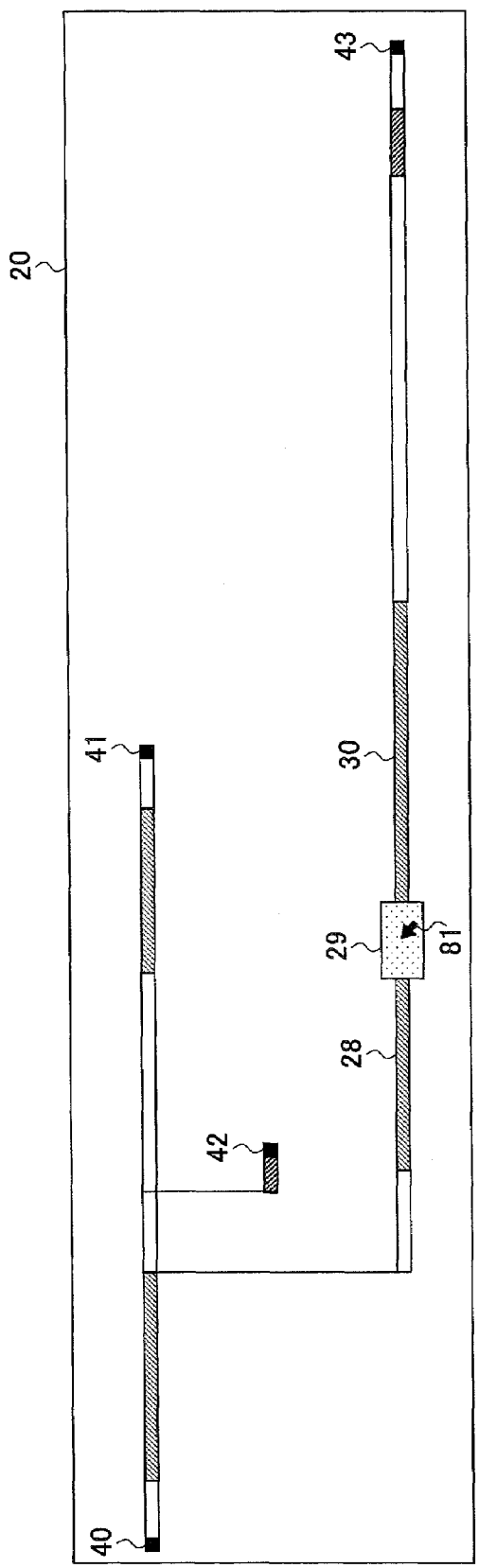
FIG. 17 is a drawing for explaining the insertion of a cell.

FIG. 17 is a drawing for explaining the insertion of a cell. What is shown in FIG. 17 is the same routing display 20 that is shown in FIG. 4, for example. In order to insert a cell into a point on the line segment 29, the layout designer positions a mouse pointer 81 on the line segment 29, and then clicks a mouse button. In response to the click of the mouse button, the list of buffers as shown in FIG. 16 is displayed, for example. When a certain buffer is selected, the selected buffer is inserted into the point on the line segment 29.

Figure 18:
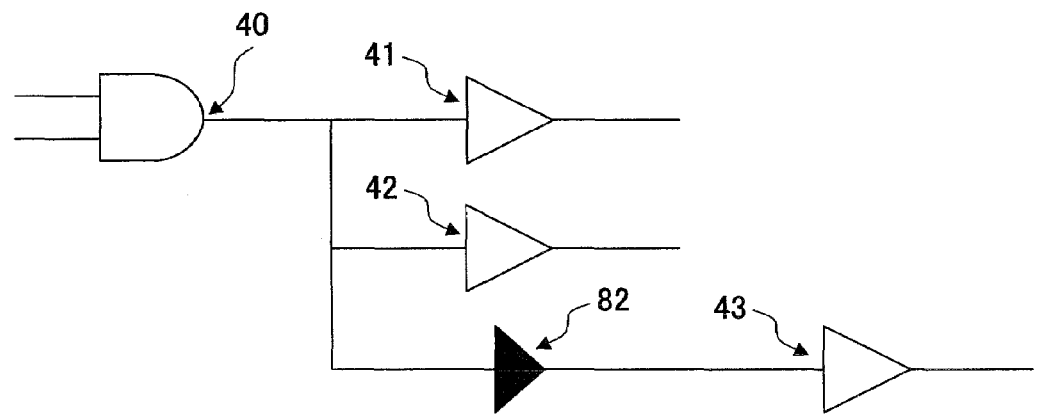
FIG. 18 is a drawing for explaining the insertion of a cell in logical design.

In so doing, the layout editor knows that the cell to be inserted is the cell that is selected as described above, and that the position of cell insertion is at the point on the line segment 29, so that the layout editor can automatically generate and issue a cell insertion requesting command with respect to the logical design data and the physical design data. Namely, the layout editor inserts a buffer 82 into the specified cell insertion point in the logical design data as shown in FIG. 18. The logical design shown in FIG. 18 does not have to be displayed on screen.

Figure 19:
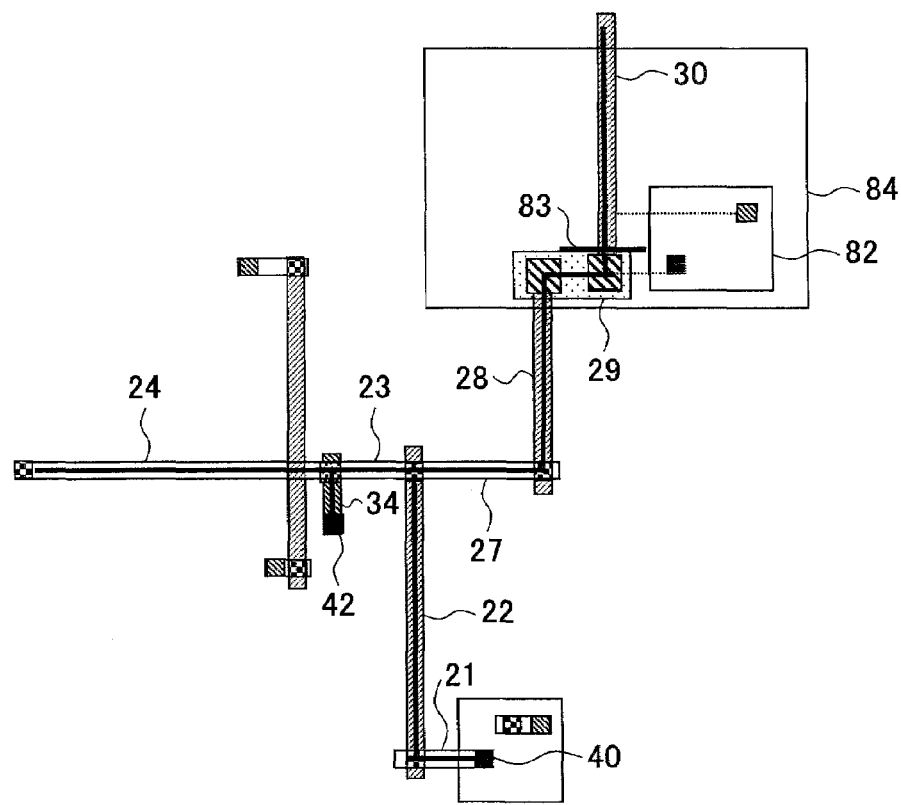
FIG. 19 is a drawing for explaining the insertion of a cell in layout.

FIG. 19 is a drawing showing a portion of the layout display shown in FIG. 5. When the layout editor automatically generates and issues a cell insertion requesting command with respect to the physical design data, the buffer 82 is displayed at proper position inside a unit-size placement area 84 including the line segment 29, and an interconnect line of the existing net is cut at the position of an insertion point 83, as shown in FIG. 19. When this is done, the line segment 30 is not removed but left intact, and is registered as part of a new net that extends from the output pin of the buffer 82.

The portions shown in dotted lines in FIG. 19 are not yet connected at this stage. These portions may subsequently be connected manually. Alternatively, these portions may be connected automatically by the layout editor.

Figure 20:
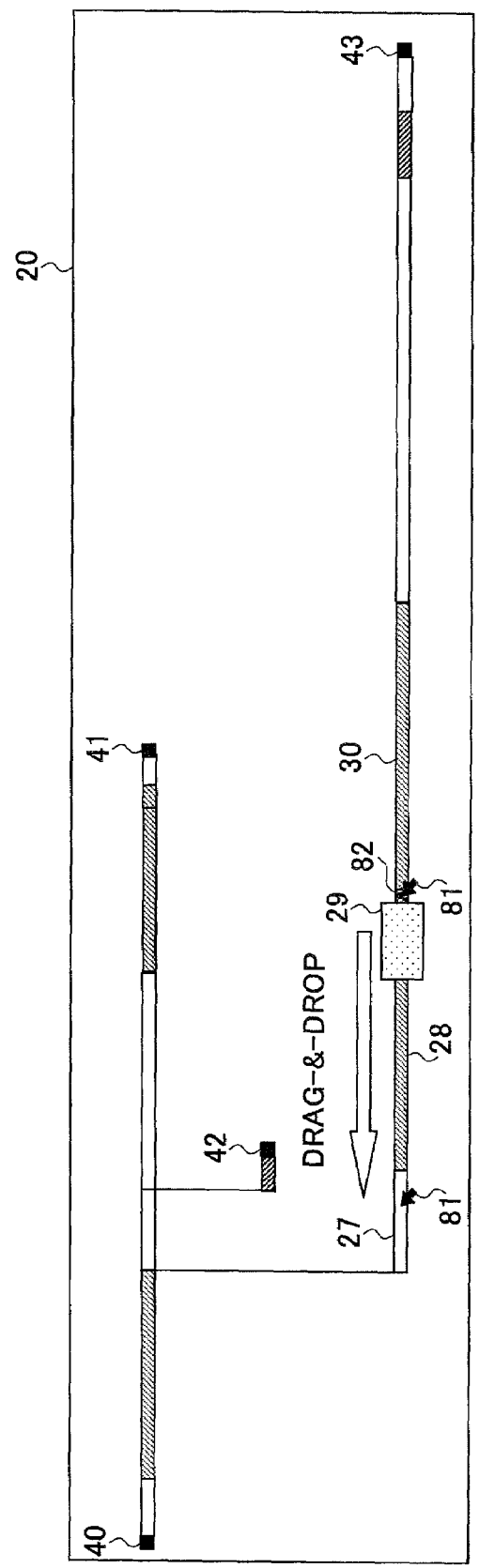
FIG. 20 is a drawing for explaining the displacement of a cell.

FIG. 20 is a drawing for explaining the displacement of a cell. What is shown in FIG. 20 is the routing display 20 that is obtained after the insertion of a cell as shown in FIG. 17, for example. In order to displace the buffer 82 inserted between the line segment 29 and the line segment 30, for example, the layout designer positions the mouse pointer 81 on the buffer 82, and then performs a drag-&-drop to move the buffer 82 to the line segment 27.

In so doing, the layout editor knows which cell is to be displaced and to which position the cell is to be displaced, so that the layout editor can automatically generate and issue a cell displacement requesting command with respect to the physical design data. In this example, the logical design data is not modified since the logical structure does not change due to the change of cell position from the original cell position to the destination cell position.

Figure 21:
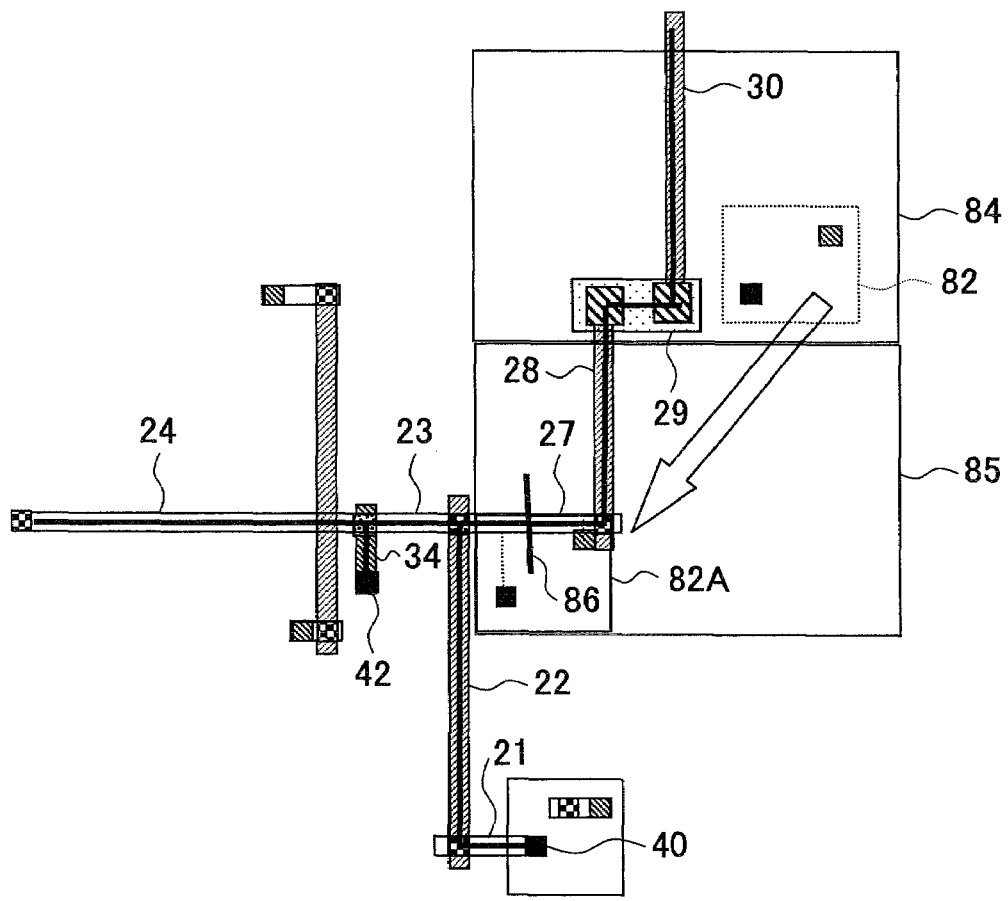
FIG. 21 is a drawing for explaining the displacement of a cell in layout.

FIG. 21 is a drawing showing a portion of the layout display shown in FIG. 5. When the layout editor automatically generates and issues a cell displacement requesting command with respect to the physical design data, the buffer 82 is displaced to a proper position inside the unit-size placement area 85 including the line segment 27, and an interconnect line of the existing net is cut at the position of an insertion point 86, as shown in FIG. 21. When this is done, a portion of the line segment 27 extending further from the severed point and the line segments 28 and 29 are not removed but left intact, and are registered as part of a new net that extends from the output pin of a displaced buffer 82A.

The portions shown in dotted lines in FIG. 21 are not yet connected at this stage. These portions may subsequently be connected manually. Alternatively, these portions may be connected automatically by the layout editor.

Figure 22:
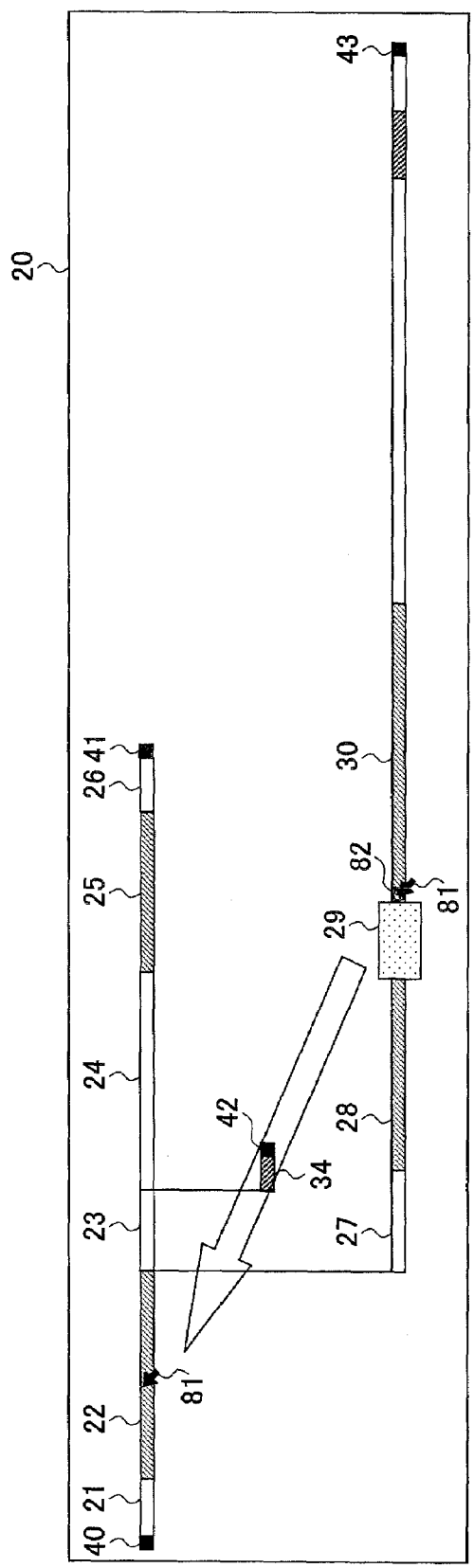
FIG. 22 is a drawing for explaining another example of the displacement of a cell.

FIG. 22 is a drawing for explaining another example of the displacement of a cell. What is shown in FIG. 22 is the routing display 20 that is obtained after the insertion of a cell as shown in FIG. 17, for example. In order to displace the buffer 82 inserted between the line segment 29 and the line segment 30, for example, the layout designer positions the mouse pointer 81 on the buffer 82, and then performs a drag-&-drop to move the buffer 82 to the line segment 22.

Figure 23:
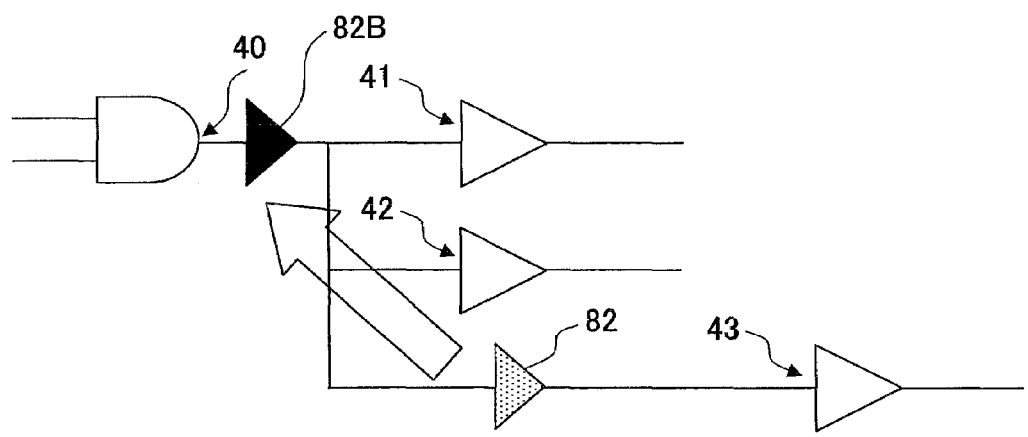
FIG. 23 is a drawing for explaining the displacement of a cell in logical design.

In so doing, the layout editor knows which cell is to be displaced and to which position the cell is to be displaced, so that the layout editor can automatically generate and issue a cell displacement requesting command with respect to the logical design data and the physical design data. Namely, the layout editor removes the buffer 82 and inserts it as a buffer 82B into the displacement destination in the logical design data as shown in FIG. 23. When this is done, the line segments facing each other across the removed portion are merged and registered as a single net. The logical design shown in FIG. 23 does not have to be displayed on screen.

Figure 24:
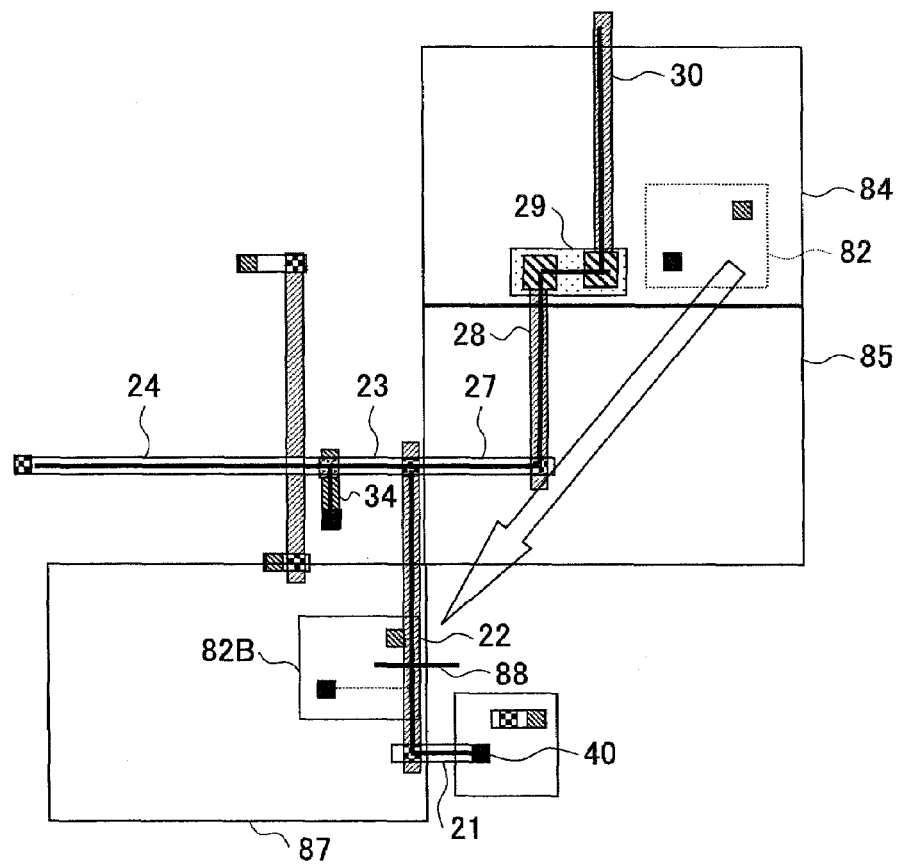
FIG. 24 is a drawing for explaining the displacement of a cell in layout.

FIG. 24 is a drawing showing a portion of the layout display shown in FIG. 5. When the layout editor automatically generates and issues a cell displacement requesting command with respect to the physical design data, the buffer 82 is displaced to a proper position inside the unit-size placement area 87 including an insertion point 88 on the line segment 22, and an interconnect line of the existing net is cut at the insertion point 88, as shown in FIG. 24. When this is done, a portion of the line segment 22 extending further from the severed point 88 and the following line segments are not removed but left intact, and are registered as part of a new net that extends from the output pin of a displaced buffer 82B.

The portions shown in dotted lines in FIG. 24 are not yet connected at this stage. These portions may subsequently be connected manually. Alternatively, these portions may be connected automatically by the layout editor.

Figure 25:
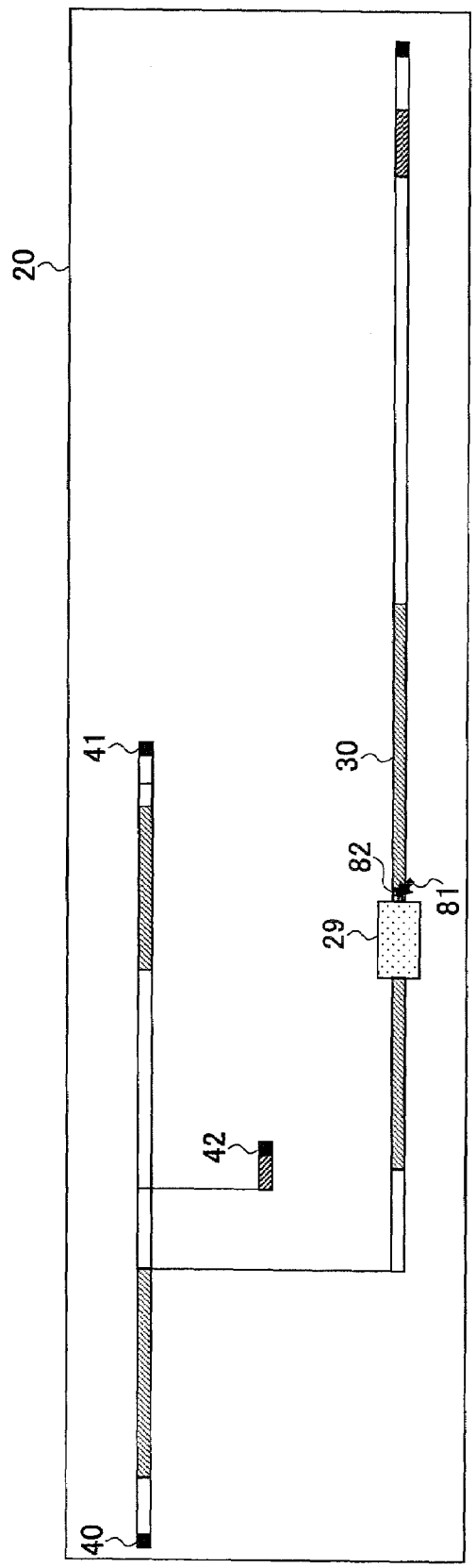
FIG. 25 is a drawing for explaining the removal of a cell.

FIG. 25 is a drawing for explaining the removal of a cell. What is shown in FIG. 25 is the routing display 20 that is obtained after the insertion of a cell as shown in FIG. 17, for example. In order to remove the buffer 82 inserted between the line segment 29 and the line segment 30, for example, the layout designer positions the mouse pointer 81 on the buffer 82, and then clicks a mouse button. In response to the click of the mouse button, a removal option is displayed, for example. When this removal option is selected, the selected buffer is removed.

Figure 26:
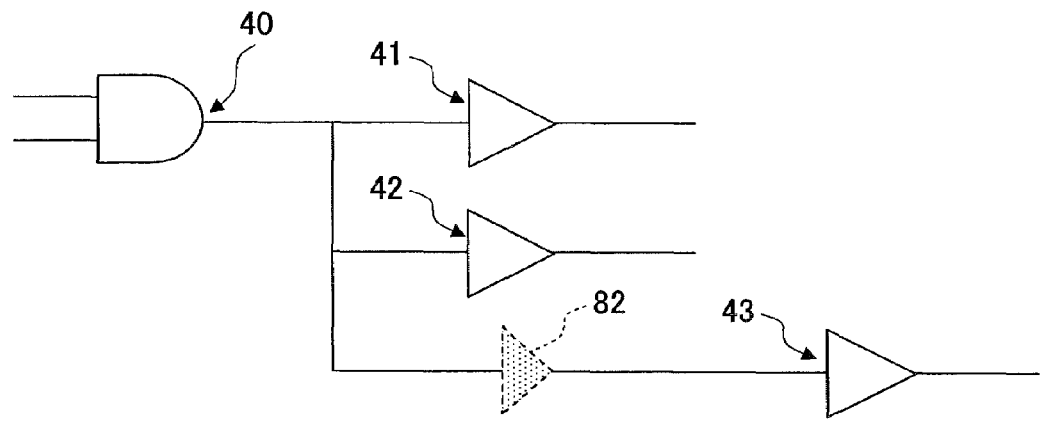
FIG. 26 is a drawing for explaining the removal of a cell in logical design.

In so doing, the layout editor knows which cell is to be removed, so that the layout editor can automatically generate and issue a cell removal requesting command with respect to the logical design data and the physical design data. Namely, the layout editor removes the buffer 82 in the logical design data as shown in dotted lines in FIG. 26. When this is done, the line segments facing each other across the removed portion are merged and registered as a single net. The logical design shown in FIG. 26 does not have to be displayed on screen.

Figure 27:
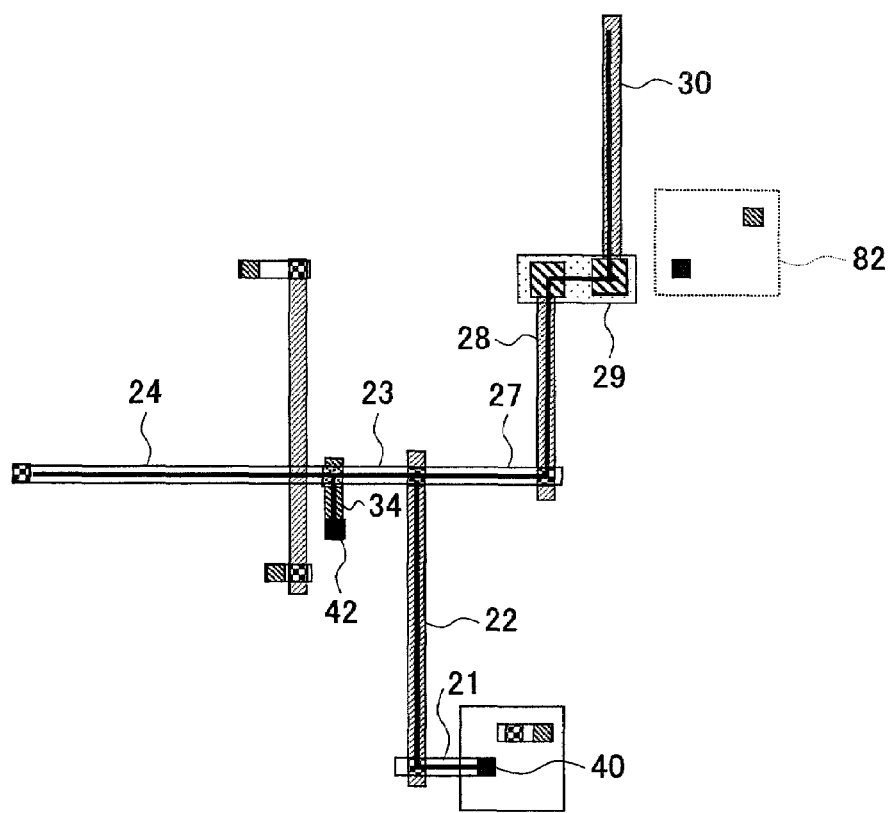
FIG. 27 is a drawing for explaining the removal of a cell in layout.

FIG. 27 is a drawing showing a portion of the layout display shown in FIG. 5. When the layout editor automatically generates and issues a cell removal requesting command with respect to the physical design data, the buffer 82 is removed as shown in dotted lines in FIG. 27, and the line segment 30 is registered as part of the net to which the line segment 29 belongs.

Figure 28:
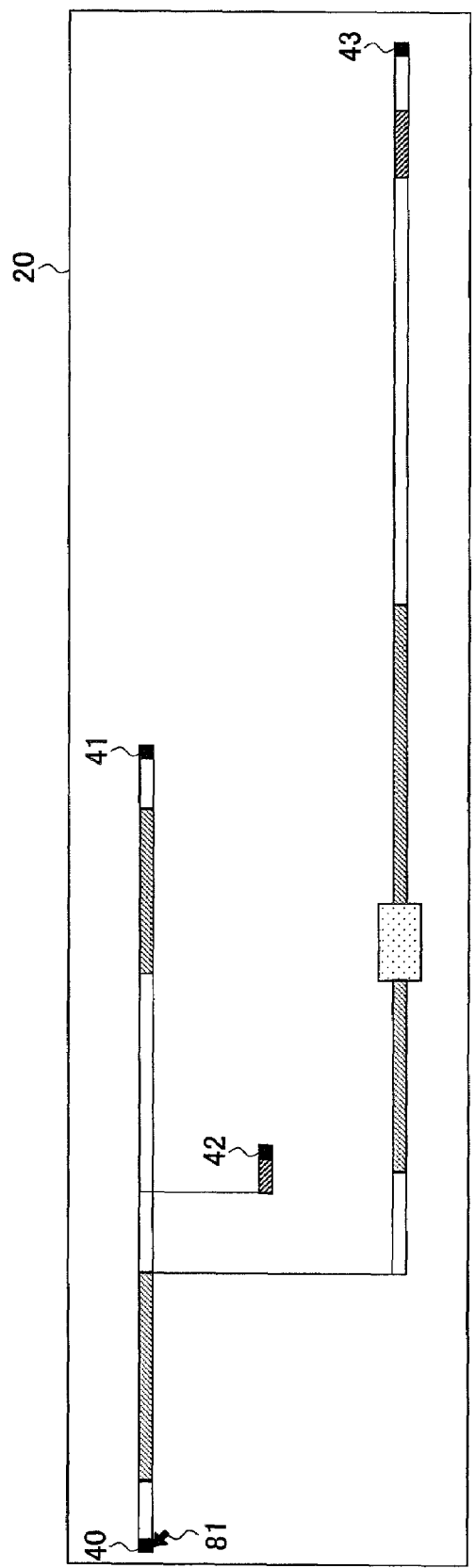
FIG. 28 is a drawing for explaining the resizing of a cell.

FIG. 28 is a drawing for explaining the resizing of a cell. What is shown in FIG. 28 is the same routing display 20 that is shown in FIG. 4, for example. In order to resize the cell corresponding to the output pin 40 so as to change the drive power, the layout designer positions the mouse pointer 81 on the output pin 40, and then clicks a mouse button. In response to the click of the mouse button, a resize option is displayed, for example. When this resize option is selected, a list of cells is displayed. When a certain buffer is selected from the list of cells, the cell of the output pin 40 is changed to the selected cell.

Figure 29:
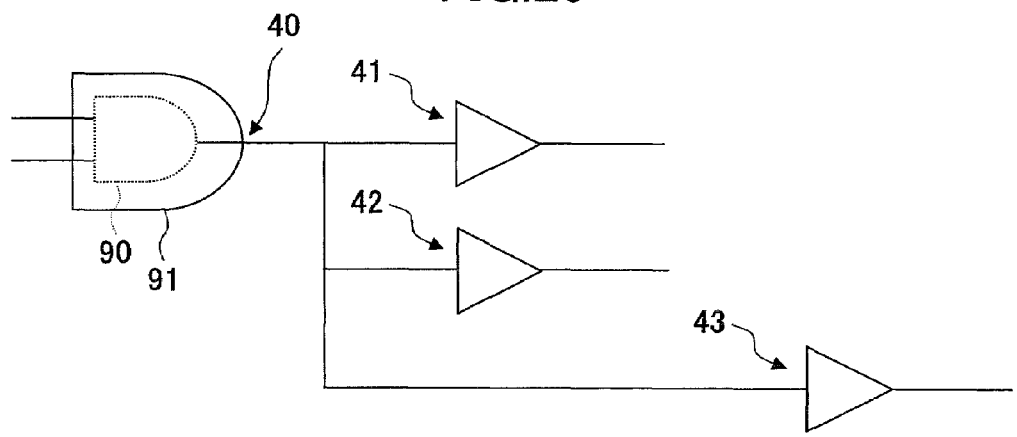
FIG. 29 is a drawing for explaining the resizing of a cell in logical design.

In so doing, the layout editor knows which type of cell is to be used after the change and at which position the cell is to be changed, so that the layout editor can automatically generate and issue a cell resize requesting command with respect to the logical design data and the physical design data. Namely, the layout editor replaces a cell 90 corresponding to the output pin 40 with a selected cell 91 as shown in FIG. 29. The logical design shown in FIG. 29 does not have to be displayed on screen.

Figure 30:
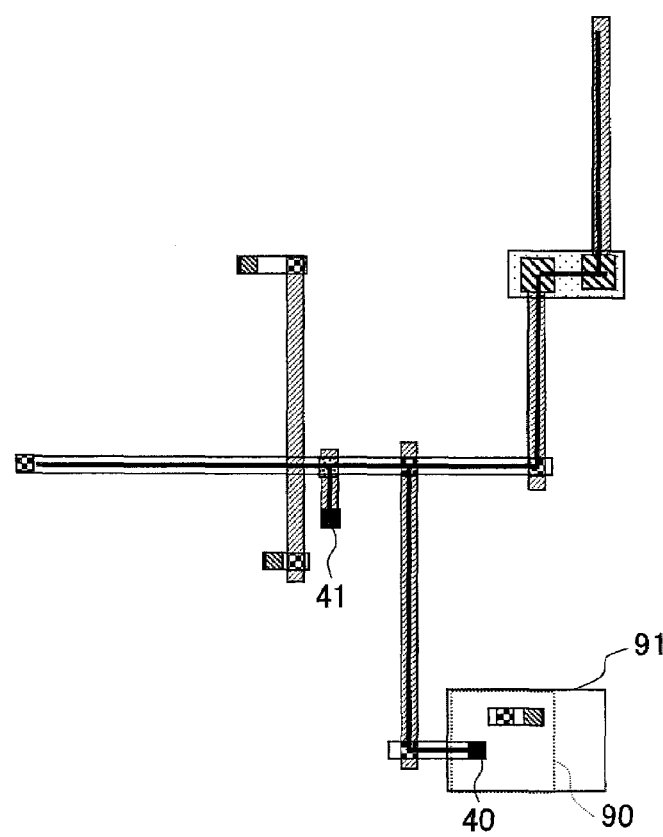
FIG. 30 is a drawing for explaining the resizing of a cell in layout.

FIG. 30 is a drawing showing a portion of the layout display shown in FIG. 5. When the layout editor automatically generates and issues a cell resize requesting command with respect to the physical design data, the cell 90 corresponding to the output pin 40 is replaced with the selected cell 91 as shown in FIG. 30. In this manner, the drive power for driving the net connected to the output pin 40 can be modified.

Figure 31:
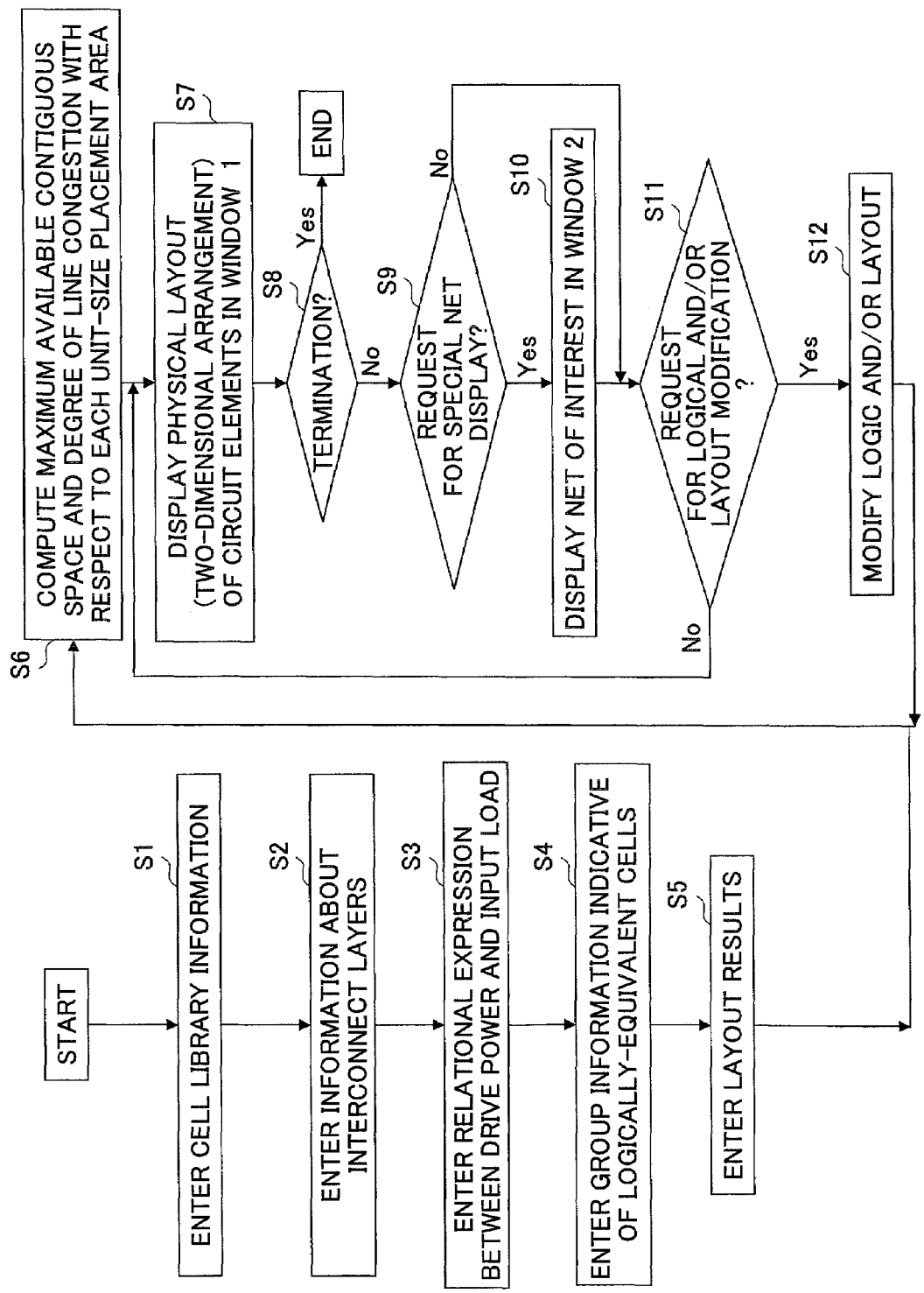
FIG. 31 is a flowchart showing the operation of the layout editor apparatus according to the present invention.

FIG. 31 is a flowchart showing the operation of the layout editor apparatus according to the present invention. At step s1, cell library information is entered. Namely, the layout editor apparatus reads the cell library information from a predetermined data storage unit. The cell library information includes cell size, the drive power of a cell output pin, and the input load of a cell input pin, etc.

At step S2, information about each interconnect layer is entered. Namely, the layout editor apparatus reads the information about each interconnect layer from a predetermined data storage unit. The information about each interconnect layer includes line width, a principal axis direction, load capacitance per unit area, spacing rules, etc.

At step S3, a relational expression between the drive power and the input load to avoid a through error (i.e., error caused by signal degradation) is entered. Namely, the layout editor apparatus reads the relational expression between the drive power and the input load from a predetermined data storage unit.

At step S4, information about logically-equivalent cell groups is entered. Namely, the layout editor apparatus reads, from a predetermined data storage unit, a cell list in which only true buffers are grouped together, a cell list in which only inverter buffers are grouped together, a cell list in which only AND gates are grouped together, etc.

At step S5, the layout results are entered. Namely, the layout editor apparatus reads layout information prepared in advance from a predetermined data storage unit. The layout information includes information about the physical locations and mutual connections of circuit elements such as cells, line segments, and vias.

At step S6, the layout area is divided into a plurality of unit-size placement areas, and a maximum available contiguous space and the degree of line congestion are computed separately for each unit-size placement area. Namely, the layout editor apparatus identifies a maximum available space with respect to each unit-size placement area based on the layout information read at step S5 so as to acquire the maximum available contiguous space, and computes the sum of the numbers of available tracks for all the interconnect layers with respect to each unit-size placement area so as to acquire the degree of line congestion.

At step S7, the physical layout of circuit elements, i.e., the two-dimensional arrangement thereof, is displayed in a first window. Namely, based on the layout information read at step S5, the layout editor apparatus displays the cell arrangement in the cell placement plane (i.e., the substrate diffusion layer), the line segment arrangement in each interconnect layer provided on top thereof, and the via arrangement for connecting between the interconnect layers, as a plan view as viewed from above as shown in FIG. 5.

At step S8, a check is made as to whether the operation is to be terminated. Namely, if a termination command is entered, the operation of the layout editor apparatus is terminated. If no termination is requested, the procedure goes to step S9.

At step S9, a check is made as to whether a net special display request is present. When the user requests that the layout editor apparatus display the routing display 20 of the present invention as shown in FIG. 4, the result of the check is "yes", resulting in the execution of next step S10. If such request is not made, the procedure goes to step S11 by skipping step S10.

At step S10, a target net is displayed in a second window. Namely, the net of interest specified by the user as an object to be edited is displayed in the second window as a routing display 20 as shown in FIG. 4. As previously described, the user can select a display format as shown in FIG. 6, FIG. 10, FIG. 14, or FIGS. 15A and 15B according to need for display on screen.

At step S11, a check is made as to whether a request for logical modification or layout modification is present. Namely, the layout editor apparatus checks whether the user has performed a cell insertion, a cell displacement, a cell removal, or a cell change as shown in FIG. 17, FIG. 20, FIG. 22, FIG. 25, or FIG. 28 on the routing display 20. It should be noted that such modification may be directed not only to a cell but also to a line segment, for which replacement or displacement may be performed. If there is a modification request, the procedure goes to step S12. Otherwise, the procedure goes back to step S7.

At step S12, the logic and/or layout are modified. Namely, the layout editor apparatus generates and issues a command(s) for modifying the logical design data and/or physical design data in response to the user request detected at step S11. The logical design data and/or physical design data are modified in response to these commands. Thereafter, the procedure returns to step S6, from which the subsequent steps are repeated.

Figure 32:
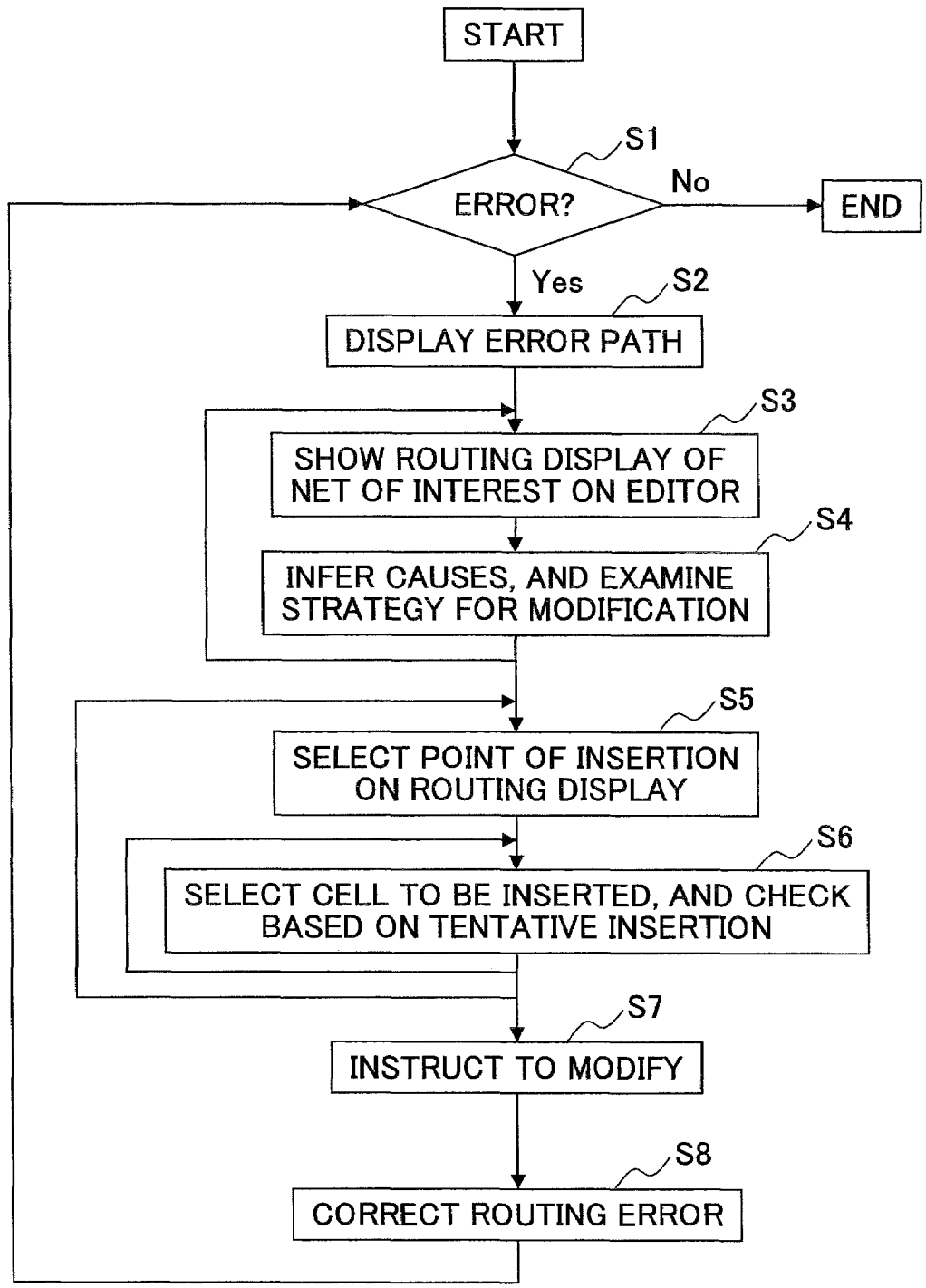
FIG. 32 is a drawing showing an example of the operational procedure performed by a user using the layout editor apparatus.

FIG. 32 is a drawing showing an example of the operational procedure performed by a user using the layout editor apparatus that performs the operation as shown in FIG. 31. The example shown in FIG. 32 illustrates a procedure relating to the insertion of a cell.

At step S1, a check is made as to whether the designed circuit contains error. If there is no error, the procedure comes to an end. If there is an error, the procedure goes to step S2.

Figure 1:
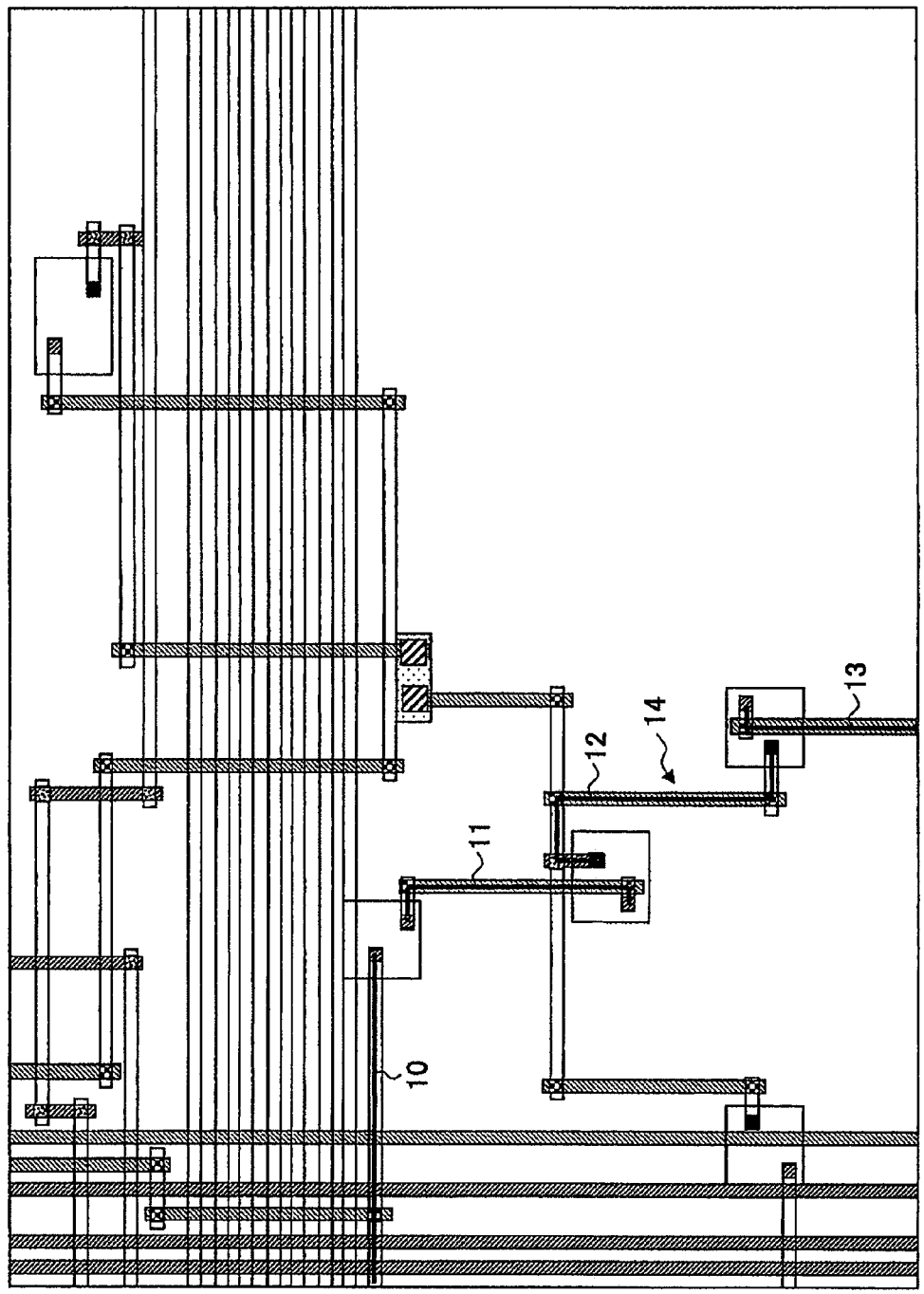
FIG. 1 is a drawing showing an example of related-art layout display.
Figure 2:
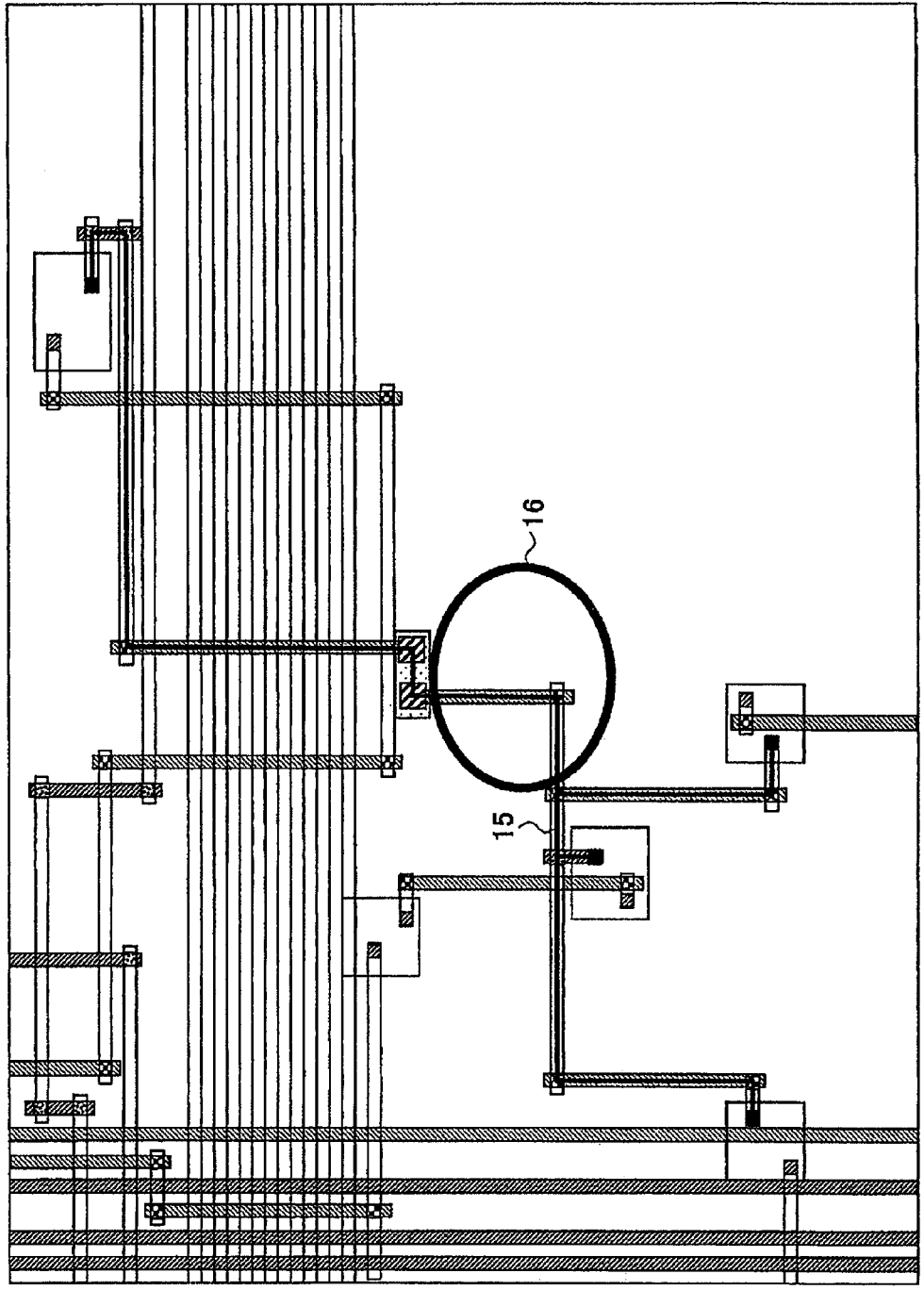
FIG. 2 is a drawing showing an example of related-art layout display.
Figure 3:
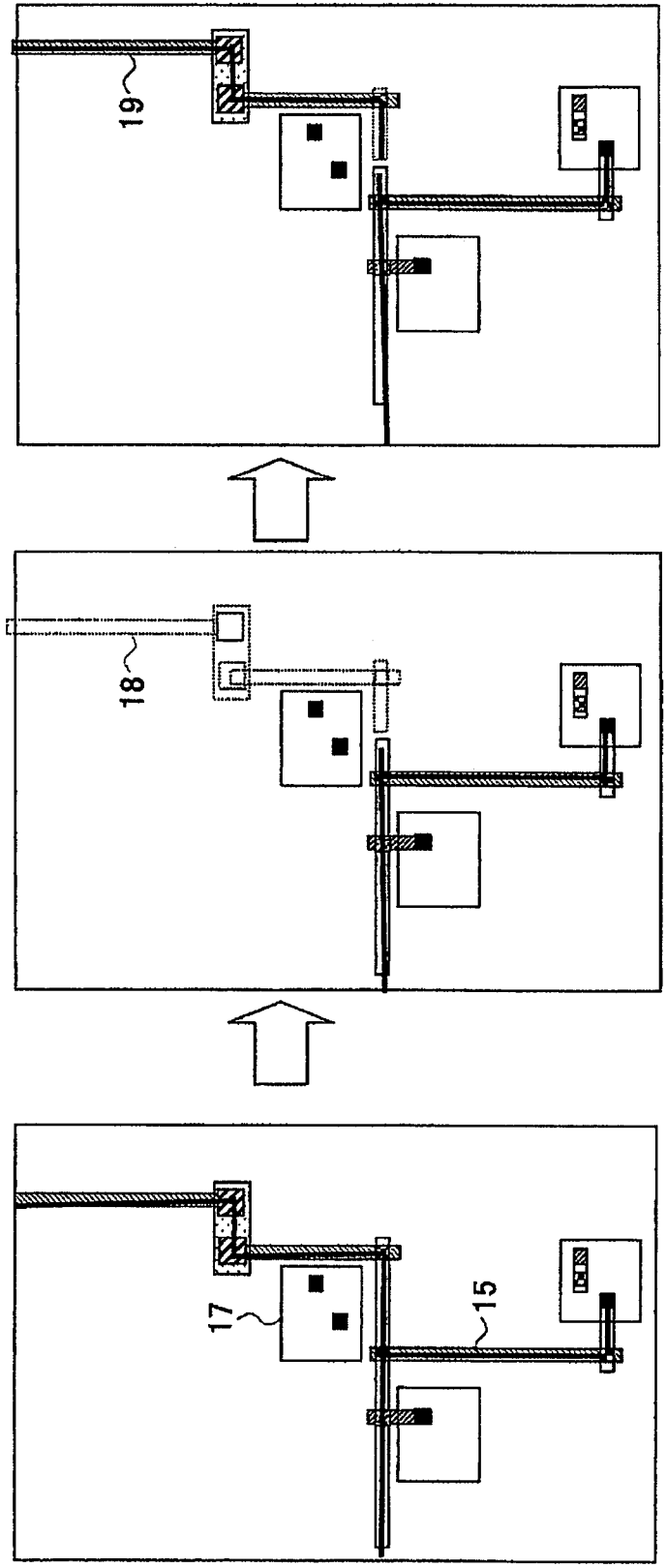
FIG. 3 is a drawing showing an example of the insertion of a cell in a related-art layout editor.

At step S2, an error path is displayed. That is, as shown in FIG. 1, for example, the circuit layout is displayed on screen such that a path having an error is displayed in such a manner as to be distinguishable from error-free paths.

At step S3, the routing display of a target net is shown on the layout editor. Namely, the user specifies a net as an object to be edited for the purpose of removing error, and uses the layout editor apparatus to display the net of interest on screen as a routing display 20 as shown in FIG. 4. The user can select a display format as shown in FIG. 6, FIG. 10, FIG. 14, or FIGS. 15A and 15B according to need for display on screen.

At step S4, the cause of error is inferred, and the strategy for modification is examined. Namely, the user selects a display format as shown in FIG. 4, FIG. 6, FIG. 10, FIG. 14, or FIGS. 15A and 15B to display the routing display 20, and, while doing so, considers how to modify the design in order to remove the error.

At step S5, the position of insertion is specified on the routing display. Namely, the user uses a mouse pointer to specify the position of insertion as shown in FIG. 17, for example.

At step S6, the cell to be inserted is selected, and a check is made through tentative insertion. Namely, the user positions the mouse pointer on the point of insertion and then clicks a mouse button, thereby displaying a list of buffers. The user then selects a certain buffer, so that the selected buffer is inserted into the specified position. After this tentative insertion, the user checks the drive power of the driver, the load of the receiver, and the signal conditions on the line segments as shown in FIG. 15A or 15B, thereby checking whether such modification is proper. Thereafter, by changing the position of insertion and the type of an inserted cell through a trial and error process, the user selects a proper insertion point and a proper type for the cell to be inserted.

At step S7, a request for modification is made. Namely, the user issues the request to finalize the modification through key inputting, mouse operation, or the like. In response, the layout editor apparatus generates and issues a command(s) for modifying the logical design data and/or physical design data. The logical design data and/or physical design data are modified in response to these commands.

At step S8, the routing error is fixed. Namely, after the logical design data and/or physical design data are modified, a timing check is performed again. Thereafter, the procedure returns to step S1 so as to check again whether error is removed.

FIG. 33 is a drawing showing the configuration of the layout editor apparatus according to the present invention.

As shown in FIG. 33, the layout editor apparatus according to the present invention is implemented as a computer such as a personal computer, an engineering workstation, or the like The apparatus of FIG. 49 includes a computer 510, a display apparatus 520 connected to the computer 510, a communication apparatus 523, and an input apparatus. The input apparatus includes a keyboard 521 and a mouse 522. The computer 510 includes a CPU 511, a ROM 513, a secondary storage device 514 such as a hard disk, a removable-medium storage device 515, and an interface 516.

The keyboard 521 and mouse 522 provide user interface, and receive various commands for operating the computer 510 and user responses responding to data requests or the like. The display apparatus 520 displays the results of processing by the computer 510, and further displays various data that makes it possible for the user to communicate with the computer 510. The communication apparatus 523 provides for communication to be conduced with a remote site, and may include a modem, a network interface, or the like.

The layout editor according to the present invention is provided as a computer program executable by the computer 510. This computer program is stored in a memory medium M that is mountable to the removable-medium storage device 515. The computer program is loaded to the RAM 512 or to the secondary storage device 514 from the memory medium M through the removable-medium storage device 515. Alternatively, the computer program may be stored in a remote memory medium (not shown), and is loaded to the RAM 512 or to the secondary storage device 514 from the remote memory medium through the communication apparatus 523 and the interface 516.

Upon user instruction for program execution entered through the keyboard 521 and/or the mouse 522, the CPU 511 loads the program to the RAM 512 from the memory medium M, the remote memory medium, or the secondary storage device 514. The CPU 511 executes the program loaded to the RAM 512 by use of an available memory space of the RAM 512 as a work area, and continues processing while communicating with the user as such a need arises. The ROM 513 stores therein control programs for the purpose of controlling basic operations of the computer 510.

The execution of the computer program by the CPU 511 as described above achieves the functions of the layout editor as described in the embodiments. For example, the routing display 20 according to the present invention is displayed on screen as shown in FIG. 4. While visually inspecting the routing display 20, the user may make modifications such as cell insertion, cell displacement, cell removal, cell change, line segment change, line segment displacement, etc.

In order to display the routing display 20 on screen, the CPU 511 extracts information about the net of interest selected by the user as net data of interest from the layout information regarding two-dimensional arrangement in each layer stored in the RAM 512 or the secondary storage device 514. In so doing, the CPU 511 extracts the physical length and physical width of each line segment constituting the net of interest, and identifies the line segments, branch points, and one or more input pins coupled to each output pin. The CPU 511 draws an output pin in the image frame memory (which is a portion of the RAM 512 in the case of FIG. 33)

corresponding to the screen of the display apparatus 520, and draws each of the line segments coupled to this output pin such that these line segments are connected together to form a straight line extending in a first direction on the screen, such that the displayed lengths of these line segments are proportional to the physical lengths thereof, and such that displayed widths of these line segments are proportional to the physical widths thereof. At the terminal end of the straight line comprised of the line segments, a corresponding input pin is drawn. Different interconnect lines are drawn at respective positions displaced in a second direction perpendicular to the first direction. If there is a branch halfway through an interconnect line, a mark indicative of branching is drawn, such that the line segments corresponding to the branch part extending from the branch point are drawn at a second-direction position different from that of the interconnect line from which the branch extends.

That is, the CPU 511 executes the program to extract, from the layout data stored in data memory, the data of the net of interest indicative of at least one output pin, one or more input pins, and line segments constituting the net of interest, and the physical length and physical width of each line segment, thereby drawing the routing display in the image frame memory based on the data of the net of interest. In so doing, CPU 511 draws an output pin of the net of interest, draws each of the line segments constituting a first interconnect line connecting between the output pin and a first input pin selected from the one or more input pins so as to draw the first interconnect line as a straight line formed of the line segments connected in a line extending from the output pin only in the first direction, such that the displayed lengths of these line segments are proportional to the physical lengths thereof, and such that displayed widths of these line segments are proportional to the physical widths thereof, draws the first input pin at a terminal end of the first interconnect line extending from the output pin, draws a mark indicative of a branch point on the first interconnect line drawn as the straight line if there is a second input pin coupled to the output pin, draws each of the line segments constituting a second interconnect line connecting between the branch point and the second input pin so as to draw the second interconnect line as a straight line formed of the line segments connected in a line extending only in the first direction from a point that is displaced in a second direction perpendicular to the first direction from the branch point on the first interconnect line on display screen, such that the displayed lengths of these line segments are proportional to the physical lengths thereof, and such that displayed widths of these line segments are proportional to the physical widths thereof, and draws the second input pin at a terminal end of the second interconnect line extending from the displaced point.

Further, the present invention is not limited to these embodiments, but various variations and modifications may be made without departing from the scope of the present invention.

What is claimed is:

1. A layout editor apparatus, comprising:
a data memory to store a program, logical design data concerning a circuit, and layout data concerning the circuit;
an image frame memory to store display data representing a display screen; and
a computation unit configured to process the logical design data and the layout data based on the program stored in the data memory,
wherein the computation unit executes the program to extract, from the layout data stored in the data memory, data of a net of interest indicative of at least one output pin, one or more input pins, and line segments constituting the net of interest, and physical lengths and physical widths of the line segments, and draws the display screen in the image frame memory based on the data of the net of interest, and wherein the computation unit performs:
drawing the output pin of the net of interest;
drawing each of the line segments constituting a first interconnect line connecting between the output pin and a first input pin selected from the one or more input pins so as to draw the first interconnect line as a straight line formed of the line segments connected in a line extending from the output pin only in a first direction, such that displayed lengths of the line segments are proportional to the physical lengths thereof, and such that displayed widths of the line segments reflect the physical widths thereof;
drawing the first input pin at a terminal end of the first interconnect line extending from the output pin;
drawing a mark indicative of a branch point on the first interconnect line drawn as the straight line for a second input pin to couple to the output pin;
drawing each of the line segments constituting a second interconnect line connecting between the branch point and the second input pin so as to draw the second interconnect line as a straight line formed of the line segments connected in a line extending only in the first direction from a point that is displaced by a predetermined distance from the branch point on the first interconnect line in a second direction perpendicular to the first direction on the display screen, such that displayed lengths of the line segments are proportional to the physical lengths thereof, and such that displayed widths of the line segments reflect the physical widths thereof; and
drawing the second input pin at a terminal end of the second interconnect line extending from the displaced point.

2. The layout editor apparatus as claimed in claim 1, wherein at least one of the line segments drawn in the image frame memory are displayed together with information indicative of at least one of an interconnect layer in which said at least one of the line segments is placed, a size of space into which a cell can be inserted in a predetermined vicinity of said at least one of the line segments, a degree of line congestion in a predetermined vicinity of said at least one of the line segments, and an indication of presence/absence of a line segment adjacent to said at least one of the line segments.

3. The layout editor apparatus as claimed in claim 1, wherein the output pin, the line segments, and the one or more input pins drawn in the image frame memory are displayed together with information indicative of a drive power of the output pin, degree of signal degradation on the line segments, and a load of the one or more input pins.

4. The layout editor apparatus as claimed in claim 3, wherein upon receiving of an instruction to modify the net of interest on the display screen drawn based on the data of the net of interest, the output pin, the line segments, and the one or more input pins are displayed together with the information indicative of a drive power of the output pin, degree of signal degradation on the line segments, and a load of the one or more input pins with respect to the modified net of interest.

5. The layout editor apparatus as claimed in claim 1, wherein the computation unit executes the program to draw in the image frame memory a two-dimensional circuit placement diagram corresponding to at least part of the layout data stored in the data memory as an additional display screen separate from the display screen showing the net of interest.

6. The layout editor apparatus as claimed in claim 1, wherein upon receiving of an instruction to modify the net of interest on the display screen drawn based on the data of the net of interest, the output pin, the line segments, the logical design data and the layout data are modified according to the instruction.

7. A method of drawing routing display, comprising:
   drawing an output pin of a net of interest on a display screen;
   drawing line segments constituting a first interconnect line connecting between the output pin and a first input pin so as to draw the first interconnect line as a straight line formed of the line segments connected in a line extending from the output pin only in a first direction, such that displayed lengths of the line segments are proportional to physical lengths thereof, and such that displayed widths of the line segments reflect physical widths thereof;
   drawing the first input pin at a terminal end of the first interconnect line extending from the output pin;
   drawing a mark indicative of a branch point on the first interconnect line drawn as the straight line if there is a second input pin coupled to the output pin;
   drawing line segments constituting a second interconnect line connecting between the branch point and the second input pin so as to draw the second interconnect line as a straight line formed of the line segments connected in a line extending only in the first direction from a point that is displaced by a predetermined distance from the branch point on the first interconnect line in a second direction perpendicular to the first direction on the display screen, such that displayed lengths of the line segments are proportional to physical lengths thereof, and such that displayed widths of the line segments reflect the physical widths thereof; and
   drawing the second input pin at a terminal end of the second interconnect line extending from the displaced point.

8. The method as claimed in claim 7, wherein at least one of the drawn line segments are displayed together with information indicative of at least one of an interconnect layer in which said at least one of the line segments is placed, a size of space into which a cell can be inserted in a predetermined vicinity of said at least one of the line segments, a degree of line congestion in a predetermined vicinity of said at least one of the line segments, and an indication of presence/absence of a line segment adjacent to said at least one of the line segments.

9. The method as claimed in claim 7, wherein the output pin, the line segments, and the one or more input pins are displayed together with information indicative of a drive power of the output pin, degree of signal degradation on the line segments, and a load of the one or more input pins.

10. A record medium having a program embedded therein for causing a computer to display a routing display, said program being configured to cause the computer to perform:
   drawing an output pin of a net of interest on a display screen;
   drawing line segments constituting a first interconnect line connecting between the output pin and a first input pin so as to draw the first interconnect line as a straight line formed of the line segments connected in a line extending from the output pin only in a first direction, such that displayed lengths of the line segments are proportional to physical lengths thereof, and such that displayed widths of the line segments reflect physical widths thereof;
   drawing the first input pin at a terminal end of the first interconnect line extending from the output pin;
   drawing a mark indicative of a branch point on the first interconnect line drawn as the straight line if there is a second input pin coupled to the output pin;
   drawing line segments constituting a second interconnect line connecting between the branch point and the second input pin so as to draw the second interconnect line as a straight line formed of the line segments connected in a line extending only in the first direction from a point that is displaced by a predetermined distance from the branch point on the first interconnect line in a second direction perpendicular to the first direction on the display screen, such that displayed lengths of the line segments are proportional to physical lengths thereof, and such that displayed widths of the line segments reflect the physical widths thereof; and
   drawing the second input pin at a terminal end of the second interconnect line extending from the displaced point.

* * * * *

UNITED STATES PATENT AND TRADEMARK OFFICE
CERTIFICATE OF CORRECTION

PATENT NO. : 7,353,482 B2  Page 1 of 1
APPLICATION NO. : 11/419909
DATED : April 1, 2008
INVENTOR(S) : Ikuko Murakawa It is certified that error appears in the above-identified patent and that said Letters Patent is hereby corrected as shown below:

Column 18, Line 60, after "receiving" delete "of".

Column 19, Line 9, after "receiving" delete "of".

Column 19, Line 29, change "if there is" to --for--.

Column 19, Line 30, change "coupled to" to --to couple--.

Column 20, Line 30, change "if there is" to --for--.

Column 20, Line 31, change "coupled to" to --to couple--.

Signed and Sealed this

Nineteenth Day of August, 2008

JON W. DUDAS
*Director of the United States Patent and Trademark Office*